(12) United States Patent
Kojima

(10) Patent No.: US 8,037,841 B2
(45) Date of Patent: Oct. 18, 2011

(54) LIQUID DROPLET EJECTION APPARATUS, METHOD FOR MANUFACTURING ELECTRO-OPTICAL APPARATUS, ELECTRO-OPTICAL APPARATUS, AND ELECTRONIC APPARATUS

(75) Inventor: Kenji Kojima, Suwa (JP)

(73) Assignee: Seiko Epson Corporation (JP)

( * ) Notice: Subject to any disclaimer, the term of this patent is extended or adjusted under 35 U.S.C. 154(b) by 1037 days.

(21) Appl. No.: 11/974,631

(22) Filed: Oct. 15, 2007

(65) Prior Publication Data

US 2008/0088662 A1 Apr. 17, 2008

(30) Foreign Application Priority Data

Oct. 17, 2006 (JP) .................................. 2006-283103

(51) Int. Cl.
*B05B 15/02* (2006.01)
*B41J 2/165* (2006.01)
*B05C 11/00* (2006.01)

(52) U.S. Cl. ........ 118/302; 118/305; 118/501; 118/323; 118/681; 118/687; 118/713; 347/29; 347/36

(58) Field of Classification Search .......... 118/313–315, 118/300, 305, 323, 321, 681, 687, 500, 501, 118/302, 712, 713; 347/22–36, 38, 19, 40, 347/47, 20, 37; 239/106, 121
See application file for complete search history.

(56) References Cited

U.S. PATENT DOCUMENTS

| 6,991,680 B2 * | 1/2006 | Kojima | 118/302 |
| 2006/0050106 A1 * | 3/2006 | Kojima | 347/37 |

FOREIGN PATENT DOCUMENTS

| JP | 2004-014393 | 1/2004 |
| JP | 2006-076067 | 3/2006 |

* cited by examiner

*Primary Examiner* — Yewebdar Tadesse
(74) *Attorney, Agent, or Firm* — Harness, Dickey & Pierce, P.L.C.

(57) ABSTRACT

A liquid droplet ejection apparatus includes an ejection inspecting section for recognizing an inspection pattern printed on a printing unit as an image, and inspecting ejection performance of the functional liquid droplet ejection heads, a workpiece alignment section for aligning a workpiece relative to a set table, a table moving section for moving the set table between the printing area and an alignment position, a unit moving section for moving the printing unit between a retracted position and an inspection position, and a controller for controlling the functional liquid droplet ejection heads, the ejection inspecting section, the table moving section, the unit moving section, and the workpiece alignment section. The controller allows alignment processing of moving the set table to the alignment position and aligning the workpiece and inspection processing of moving the printing unit to the inspection position and performing inspection of the ejection performance to be performed simultaneously.

7 Claims, 29 Drawing Sheets

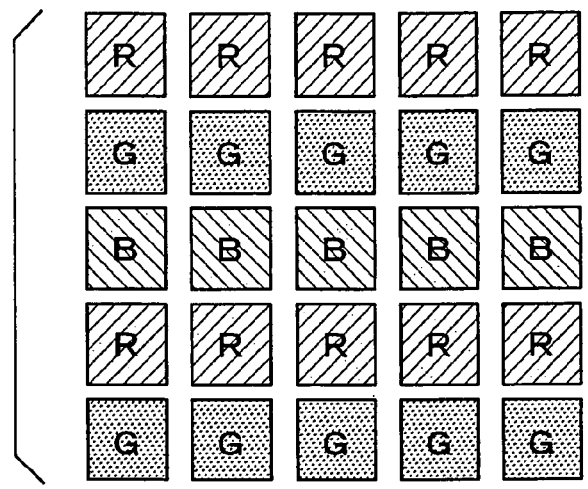
Fig. 6A    STRIPE
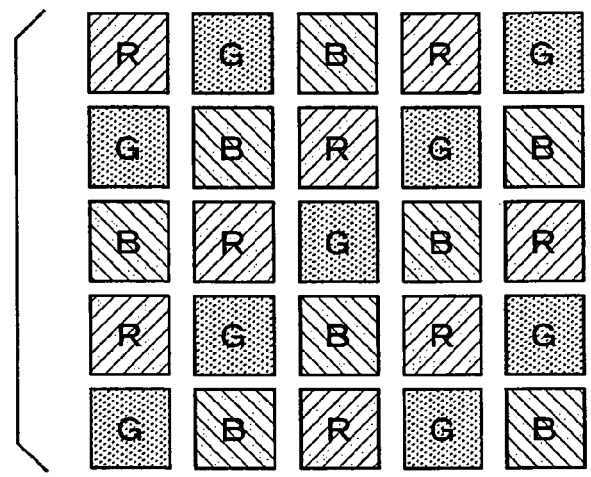
Fig. 6B    MOSAIC
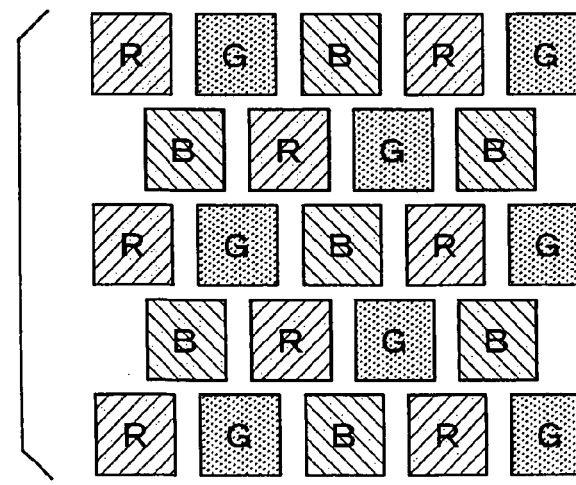
Fig. 6C    DELTA

LIQUID DROPLET EJECTION APPARATUS, METHOD FOR MANUFACTURING ELECTRO-OPTICAL APPARATUS, ELECTRO-OPTICAL APPARATUS, AND ELECTRONIC APPARATUS

The entire disclosure of Japanese Patent Application No. 2006-283103, filed Oct. 17, 2006 is expressly incorporated by reference herein.

BACKGROUND

1. Technical Field

The present invention relates to liquid droplet ejection apparatuses which perform printing processing on a workpiece using an ink-jet functional liquid droplet ejection head, and particularly relates to a liquid droplet ejection apparatus on which an ejection inspecting unit for inspecting the functional liquid droplet ejection head, a method for manufacturing an electro-optical apparatus, an electro-optical apparatus, and an electronic apparatus.

2. Related Art

In general, a known liquid droplet ejection apparatus forms light-emitting elements serving as pixels for a color filter of a liquid crystal display device or an organic EL (electroluminescence) device by performing printing processing using functional liquid droplet ejection heads. The liquid droplet ejection apparatus includes a set table on which a workpiece is set and a printing unit which is subjected to an inspection ejection operation performed for detecting an ejection defect by ejecting functional liquid from the functional liquid droplet ejection heads. The printing unit is disposed on a slider used to move the set table in a scanning direction and moves with the set table. The printing unit is subjected to the inspection operation for detecting an ejection defect of the functional liquid droplet ejection heads when the workpiece is replaced (mounted on and dismounted from the set table) by a new one. (For example, refer to Japanese Unexamined Patent Application Publication No. 2006-076067.)

However, in the inspection operation for detecting the ejection defect in the related art, image recognition processing and image processing are necessary, and furthermore, ejection results of all ejection nozzles are processed by performing batch processing a plurality of times due to angle of a camera, and accordingly considerable time is required. On the other hand, when a workpiece is replaced by a new one, since only a workpiece which has been processed is removed and a workpiece that has yet to be processed is set using a robot, the amount of time required is short. Accordingly, when a sequence operation is performed to detect an ejection defect and to replace workpieces simultaneously, an operation pause time of the set table is long, and consequently, tact time for processing a workpiece becomes longer.

SUMMARY

An advantage of some aspects of the invention is to provide a liquid droplet ejection apparatus which does not need long tact time for processing a workpiece even when an inspection of ejection function is performed on functional liquid droplet ejection heads, a method for manufacturing an electro-optical apparatus, an electro-optical apparatus, and an electronic apparatus.

According to an embodiment of the present invention, there is provided a liquid droplet ejection apparatus that performs printing processing by ejecting functional liquid from functional liquid droplet ejection heads onto a workpiece while a set table on which the workpiece is mounted and which faces a printing area moves in a scanning direction relative to the functional liquid droplet ejection heads. The liquid droplet ejection apparatus includes an ejection inspecting section configured to have a printing unit which is arranged on a movement locus of the set table and to which an inspection pattern is printed by inspection ejection using the functional liquid droplet ejection heads, configured to recognize the inspection pattern printed on the printing unit as an image, and configured to inspect ejection performance of the functional liquid droplet ejection heads, a workpiece alignment section configured to align the workpiece relative to the set table, a table moving section configured to move the set table in the scanning direction in the printing area and configured to move the set table in the scanning direction between the printing area and an alignment position located in a first side relative to the printing area, a unit moving section configured to move the printing unit independently of the set table, in the scanning direction between a retracted position located in a second side relative to the printing area and an inspection position located beneath the functional liquid droplet ejection heads, and a controller configured to control the functional liquid droplet ejection heads, the ejection inspecting section, the table moving section, the unit moving section, and the workpiece alignment section. The controller allows alignment processing of moving the set table to the alignment position and aligning the workpiece and inspection processing of moving the printing unit to the inspection position and performing the inspection ejection and inspection of the ejection performance to be performed simultaneously.

With this configuration, the table moving section and the workpiece alignment section perform alignment processing of moving the set table on which the workpiece is mounted to the alignment position and aligning the workpiece, and simultaneously, the unit moving section provided separately from the table moving section, the functional liquid droplet ejection heads, and the ejection inspecting section perform inspection processing of moving the printing unit to the inspection position and performing inspection ejection and inspection of an ejection performance. In this way, the alignment processing and the inspection processing are simultaneously performed, that is, the inspection of an ejection performance of the functional liquid droplet ejection heads can be efficiently performed by making use of time required for the alignment processing performed on the workpiece. Accordingly, the inspection of an ejection performance of the functional liquid droplet ejection heads are performed on-machine basis, and tact time required for processing a workpiece can be reduced resulting in improvement of the productivity of the workpiece.

In this case, the liquid droplet ejection apparatus may include a workpiece replacement section configured to perform replacement processing of dismounting a workpiece which has been printed from the set table and mounting a workpiece which has yet to be processed on the set table. The controller may control the workpiece replacement section to perform the replacement processing after the set table moves to the alignment position and before the workpiece is aligned, and the replacement processing and the inspection processing may be simultaneously performed.

With this configuration, since the inspection of an ejection performance of the functional liquid droplet ejection heads is performed by making use of time required for the workpiece replacement processing in addition to the time required for the alignment processing, the tact time required for processing a workpiece can be further reduced.

In this case, the table moving section may include a first slider used to support the set table and a common supporting base used to support the first slider to slide in the scanning direction. The unit moving section may include a second slider used to support the printing unit and the common supporting base used to support the second slider to slide in the scanning direction.

With this configuration, since the set table and the printing unit are supported by different sliders, the set table and the printing unit may simultaneously move. Alternatively, the set table and the printing unit may separately move without synchronization. Furthermore, since the different sliders are provided, the weight of components disposed on each of the sliders is reduced resulting in improvement of response at a time of a feeding operation in the printing processing. Moreover, even if a first slider slightly moves in X, Y, and θ directions due to an alignment operation, inspection performed by the printing unit is not influenced by this movement of the first slider. In addition, since the supporting base is used in common, a compact design can be achieved.

In this case, the liquid droplet ejection apparatus may further include a periodic flushing box which is disposed on the second slider and which is used to receive functional liquid forcibly ejected from the functional liquid droplet ejection heads.

With this configuration, the periodic flushing unit enters a waiting state until the next printing processing while receiving forcible ejection from the functional liquid droplet ejection heads on the periodic flushing box, and then proceeds to the printing processing. Since the periodic flushing box is disposed on the second slider, transition time required for changing states from a waiting state to a state of printing processing may be reduced, and accordingly, this makes it possible to effectively prevent the ejection nozzles 98 from drying out.

In this case, the printing unit may include a printing sheet on which the inspection pattern is printed, an inspection stage on which the printing sheet is mounted, and a sheet feeding section configured to feed a portion of the printing sheet which has been inspected out of the inspection stage and to feed a portion of the printing sheet which has yet to be inspected into the inspection stage. The controller may allow the workpiece to be printed and allows the printing sheet to be fed simultaneously while the printing unit is located in the retracted position.

With this configuration, since the printing processing performed on the workpiece and a feeding operation of the printing sheet are simultaneously performed while the printing unit is located in the retracted position, the feeding operation of the printing sheet can be efficiently performed by making use of time required for the printing processing. Furthermore, since the printing unit moves to the retracted position, the printing area and the set table have a predetermined distance therebetween. Accordingly, paper scraps and dust generated due to the feeding operation of the printing sheet do not become attached to the functional liquid droplet ejection heads and the workpiece mounted on the set table. Accordingly, the functional liquid droplet ejection heads and the workpiece can be kept clean.

In this case, the printing unit may further include a defect detection sensor configured to detect improper setting of the printing sheet fed to the inspection stage. The controller may allow the workpiece to be printed and may allow the defect detection sensor to detect the improper setting of the printing sheet simultaneously while the printing unit is located in the retracted position.

With this configuration, since the printing processing performed on the workpiece and detection of the improper setting of the printing sheet are simultaneously performed while the printing unit is located in the retracted position, the functional liquid droplet ejection heads are prevented from interfering with the printing sheet and a suction defect of the printing sheet can be efficiently detected by making use of the time required for the printing processing.

According to an embodiment of the invention, there is provided a method of manufacturing an electro-optical apparatus, wherein film portions are formed by ejecting functional liquid onto the workpiece using the liquid droplet ejection apparatus described above.

According to an embodiment of the invention, there is provided an electro-optical apparatus, wherein film portions are formed by ejecting functional liquid onto the workpiece using the liquid droplet ejection apparatus described above.

With this configuration, since the alignment processing performed on the workpiece and the inspection of ejection performance of the functional liquid droplet ejection heads are simultaneously performed, cycle time of manufacturing processing can be reduced and the productivity of the workpiece can be improved. Note that examples of the electro-optical apparatus (flat panel display: FPD) include a color filter, a liquid crystal display apparatus, an organic EL apparatus, a PDP apparatus, and an electron emission apparatus. Note that the electron emission apparatus includes a so-called FED (field emission display) and a so-called SED (surface-conduction electron-emitter display). An example of an electro-optical apparatus includes an apparatus having a metal wiring, a lens, a resist, and light-diffusion body formed thereon.

According to an embodiment of the invention, there is provided an electronic apparatus that employs an electro-optical apparatus manufactured by the method of manufacturing an electro-optical apparatus described above or that employs the electro-optical apparatus.

In this case, examples of the electric apparatus include a cellular phone on which the so-called flat panel display is mounted, a personal computer, and various electric apparatuses.

BRIEF DESCRIPTION OF THE DRAWINGS

The invention will be described with reference to the accompanying drawings, wherein like numbers reference like elements.

FIGS. 6A to 6C are diagrams illustrating color scheme patterns of a color filter, in which FIG. 6A shows a stripe arrangement, FIG. 6B shows a mosaic arrangement, and FIG. 6C shows a delta arrangement.

DESCRIPTION OF EXEMPLARY EMBODIMENTS

An embodiment of the present invention will be described hereinafter with reference to the accompanying drawings. A liquid droplet ejection apparatus according to this embodiment is used in a production line of a flat panel display device. For example, the liquid droplet ejection apparatus employs functional liquid droplet ejection heads using special ink or functional liquid such as luminescent resin liquid to form light-emitting elements serving as pixels of a color filter of a liquid crystal display device or an organic EL device.

Figure 1:
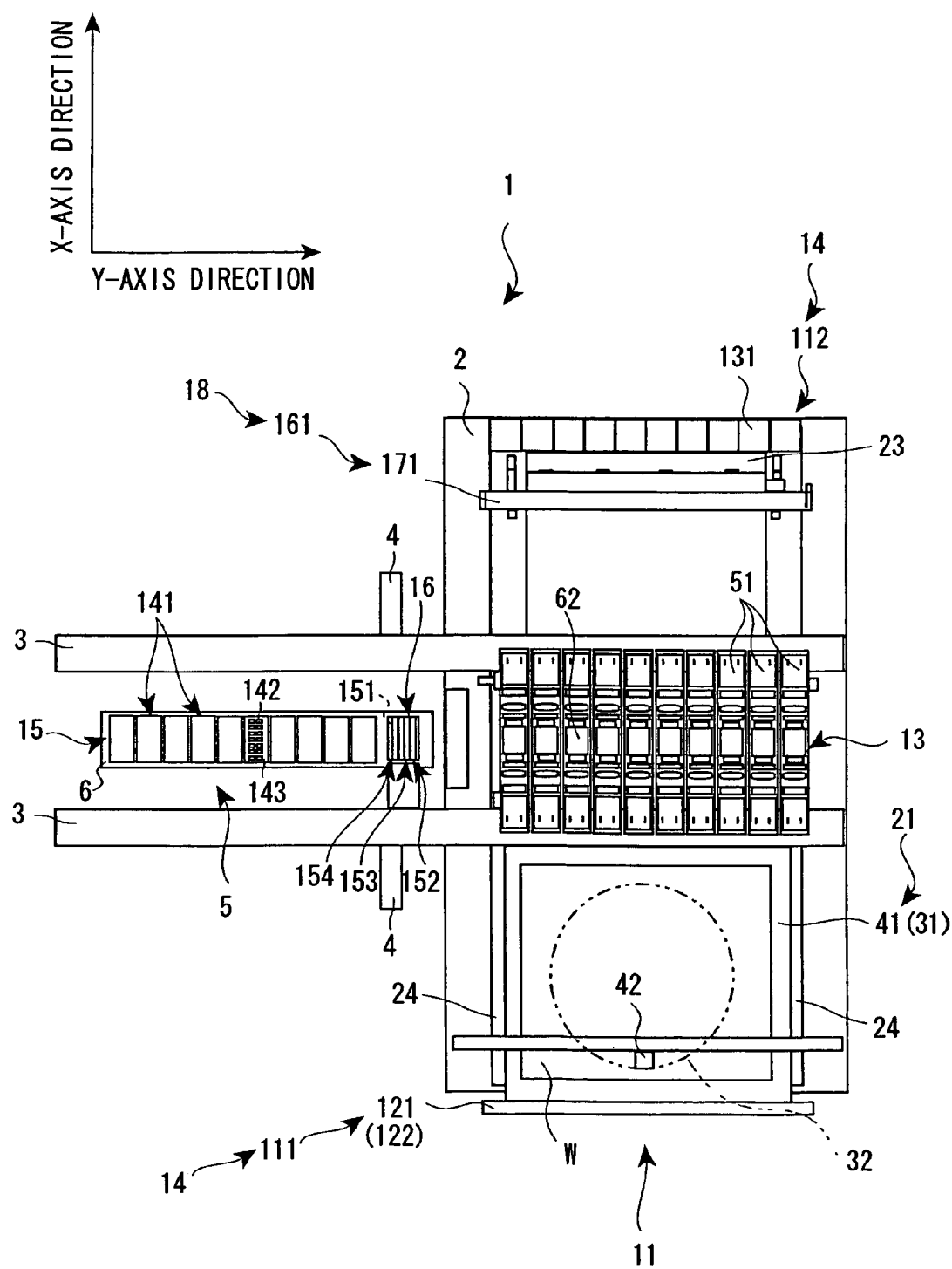
FIG. 1 is a plan view of a liquid droplet ejection apparatus according to an embodiment.
Figure 2:
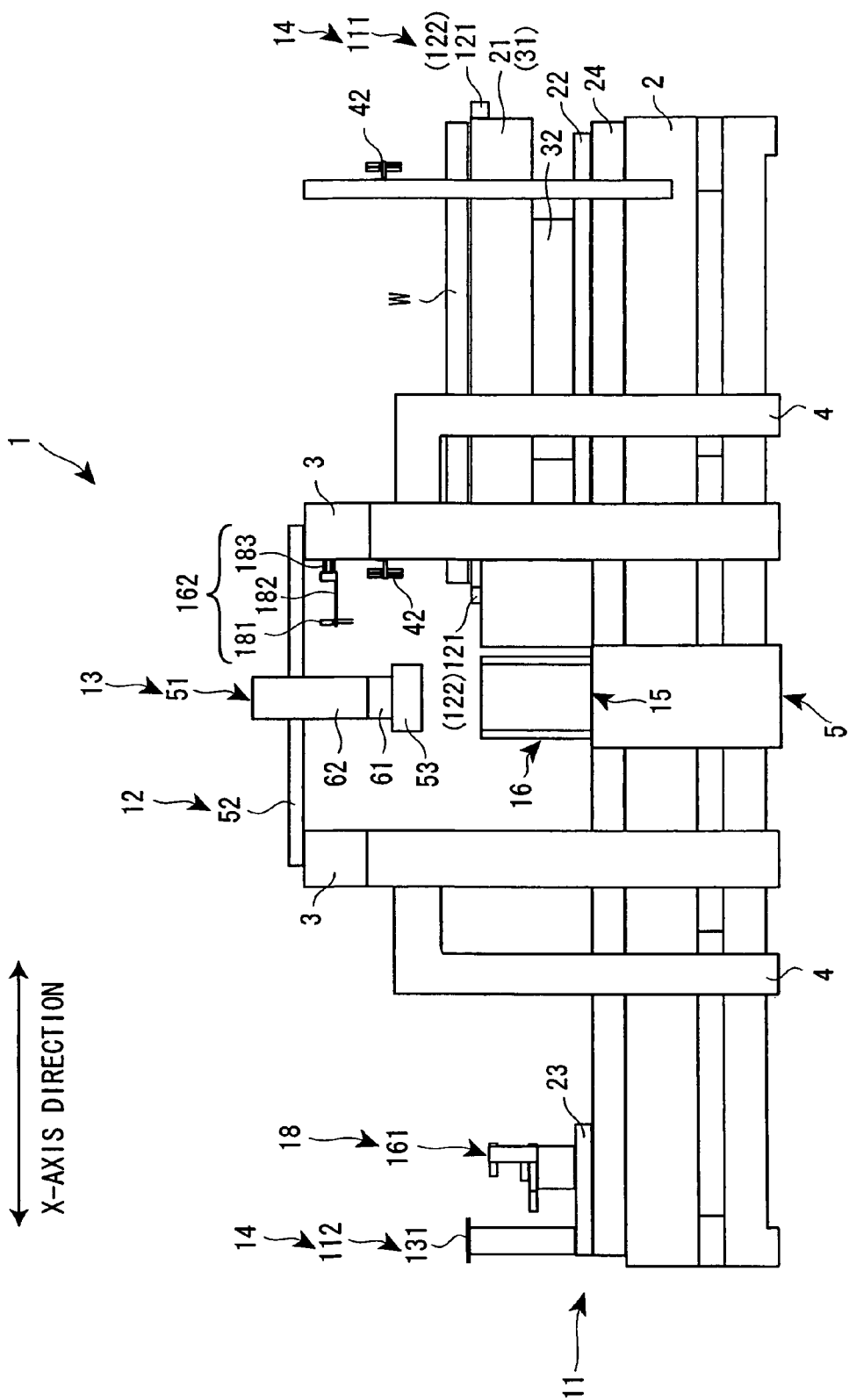
FIG. 2 is a side view of the liquid droplet ejection apparatus.

As shown in FIGS. 1 and 2, a liquid droplet ejection apparatus 1 includes an X-axis table 11, a Y-axis table 12, and ten carriage units 51. The X-axis table 11 is disposed on an X-axis supporting base 2 mounted on a stone surface plate, extends in an X-axis direction which is a main scanning direction, and moves a workpiece W in the X-axis direction (main scanning direction). The Y-axis table 12 is disposed on a pair of (two) Y-axis supporting bases 3 which is arranged so as to stride across the X-axis table 11 with a plurality of poles 4 interposed between the Y-axis supporting bases 3 and the X-axis table 11, and extends in a Y-axis direction which is a sub-scanning direction. Ten carriage units 51 include a plurality of functional liquid droplet ejection heads 17 (not shown) mounted thereon, and are arranged so as to hang from the Y-axis table 12. The functional liquid droplet ejection heads 17 are driven to perform ejection processing in synchronization with driving operations of the X-axis table 11 and the Y-axis table 12 whereby functional liquid droplets of three colors, R, G, and B are ejected and a predetermined printing pattern is printed on the workpiece W.

The liquid droplet ejection apparatus 1 further includes a maintenance unit 5 having a flushing unit 14, a suction unit 15, a wiping unit 16, and an ejection function inspection unit 18 which are used for maintenance of the functional liquid droplet ejection heads 17 so that functional maintenance and functional recovery of the functional liquid droplet ejection heads 17 are achieved. Note that, among the units constituting the maintenance unit 5, the flushing unit 14 and the ejection function inspection unit 18 are mounted on the X-axis table 11, the suction unit 15 and the wiping unit 16 are disposed on a mount 6 which is disposed so as to be displaced from the X-axis table 11 and is disposed in a position which does not disturb movement of the carriage units 51 moved using the Y-axis table 12.

Although not shown in FIGS. 1 and 2, the liquid droplet ejection apparatus 1 further includes a control unit 7 (refer to FIG. 9) which controls the entire apparatus and which controls the printing processing and the maintenance processing described above to be performed.

Components of the liquid droplet ejection apparatus 1 will be described hereinafter. As shown in FIGS. 1 and 2, the X-axis table 11 includes a set table 21, an X-axis first slider 22, an X-axis second slider 23, a pair of right and left X-axis linear motors (not shown), and a pair of (two) X-axis common supporting bases 24. The set table 21 is used to set a workpiece W. The X-axis first slider 22 is used to slidably support the set table 21 in the X direction. The X-axis second slider 23 is used to slidably support the flushing unit 14 and the ejection function inspection unit 18 in the X-axis direction. The pair of X-axis linear motors extend in the X-axis direction, are used to move the workpiece W in the X-axis direction through the X-axis first slider 22, and are used to move the flushing unit 14 and the ejection function inspection unit 18 in the X-axis direction through the X-axis second slider 23. The pair of X-axis common supporting bases 24 are arranged so as to be parallel to the X-axis linear motors and guide the X-axis first slider 22 and the X-axis second slider 23. Note that, the X-axis first slider 22 and the X-axis common supporting bases 24 constitute a table moving section, and the X-axis second slider 23 and the X-axis common supporting base 24 constitute a unit moving section.

The set table 21 includes a suction table 31 for attracting the workpiece W to be set thereto and a θ table 32 for correcting a position of the workpiece W set on the suction table 31 in a θ-axis direction. Furthermore, a pair of pre-printing flushing boxes 121 included in a pre-printing flushing unit 111 are additionally provided on a pair of sides of the set table 21 which is parallel to the Y-axis direction.

Note that a near side of the sheet shown in FIG. 1 serves as an alignment position 41 (mount position) of the workpiece W. When a workpiece W that has yet to be processed is mounted on the suction table 31 or when a processed workpiece W is dismounted, the suction table 31 moves up to the alignment position 41. Then, a workpiece W is mounted on or dismounted from (replacement) the suction table 31 using a robot arm 71 (workpiece replacement section) which will be described later (refer to FIG. 11). Furthermore, a workpiece alignment camera 42 (workpiece alignment section) is used to recognize a position of the workpiece W. In accordance with an imaging result of the workpiece alignment camera 42, data in the X-axis direction and data in the Y-axis direction are corrected, and the workpiece W is corrected in the θ direction using the θ table 32.

The Y-axis table 12 includes ten bridge plates 52 on which the ten carriage units 51 included in a head unit 13 are fixed, and ten pairs of Y-axis sliders (not shown) which support the corresponding bridge plates 52 at both sides thereof. In addition, the Y-axis table 12 includes a pair of Y-axis linear motors (not shown) which are disposed on the pair of Y-axis supporting bases 3 and which are used to move the ten bridge plates 52 in the Y-axis direction through the ten pairs of Y-axis sliders.

When the pair of linear motors are (simultaneously) driven, the Y-axis sliders move in parallel to the Y-axis direction with the pair of Y-axis supporting bases 3 as guides. Therefore, the bridge plates 52 move in the Y-axis direction along with the carriage units 51 (sub-scanning). In this case, each of the carriage units 51 may independently move by drive-controlling the Y-axis linear motors, or the ten carriage units 51 may integrally move.

Figure 4:
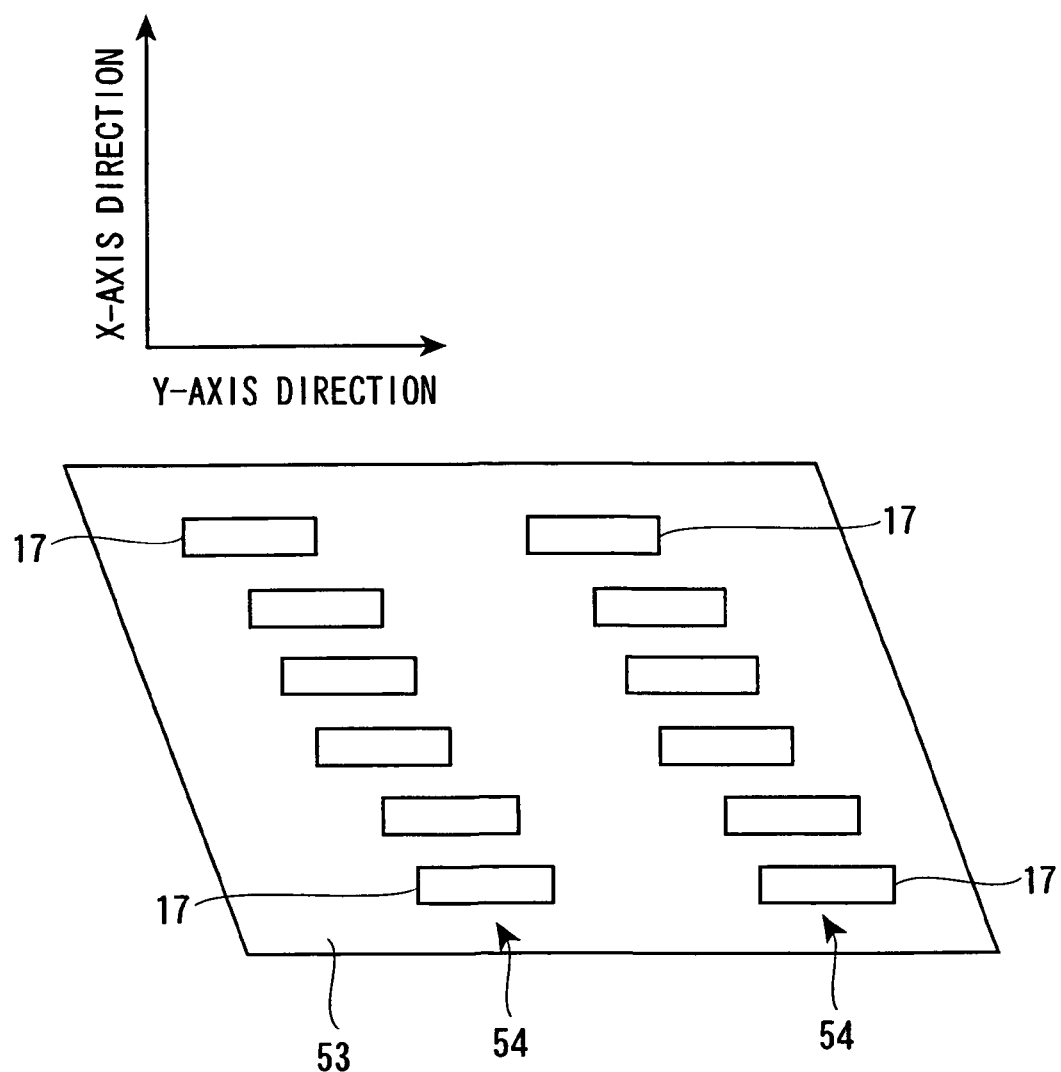
FIG. 4 is a diagram illustrating the functional liquid droplet ejection heads constituting two head groups.

Each of the carriage units 51 includes 12 functional liquid droplet ejection heads 17 and a carriage plate 53 in which the 12 functional liquid droplet ejection heads 17 are arranged thereon so as to be divided into two groups each of which has six functional liquid droplet ejection heads 17 (refer to FIG. 4).

Figure 3:
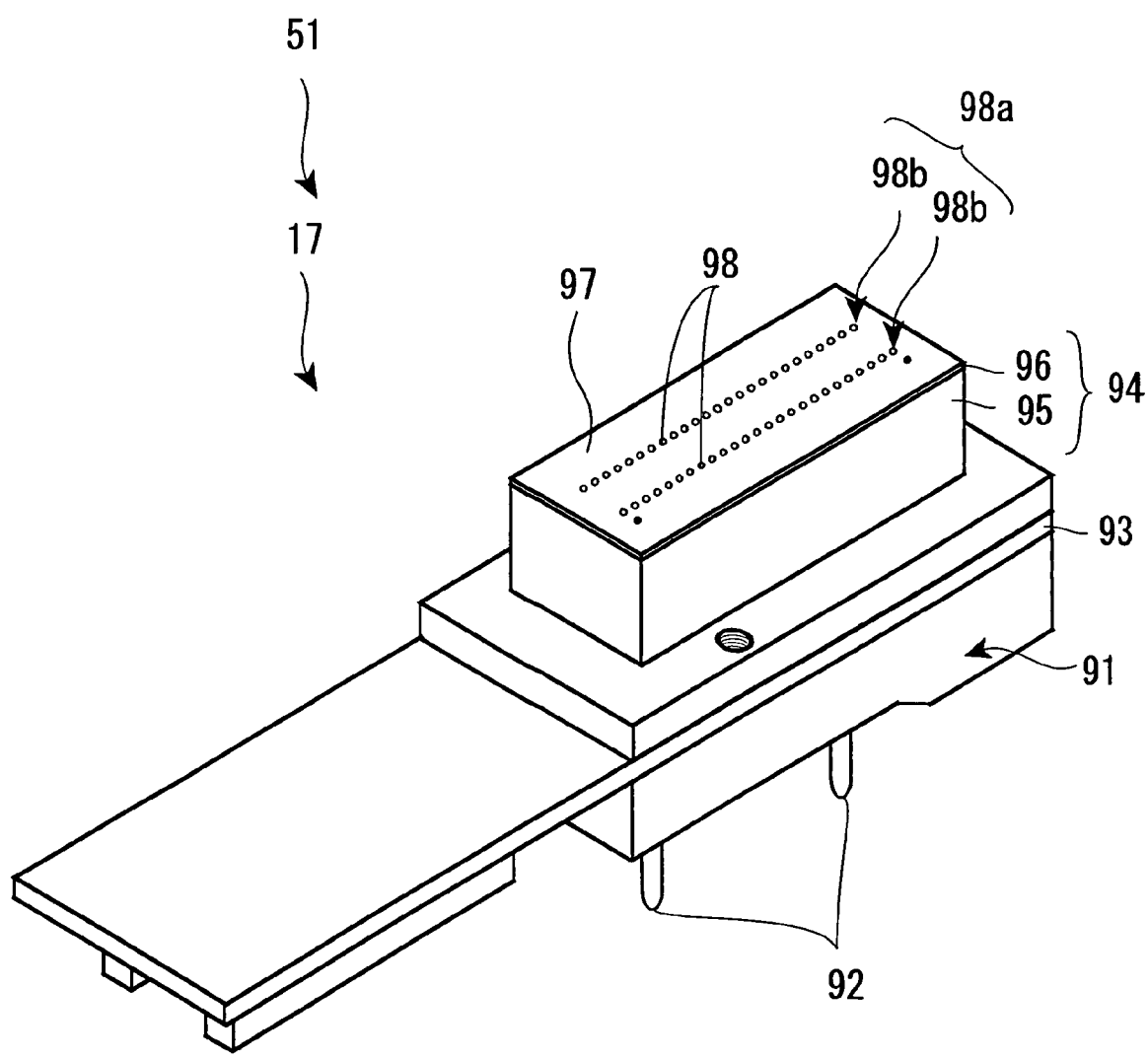
FIG. 3 is a perspective view of one of functional liquid droplet ejection heads.

As shown in FIG. 3, each of the functional liquid droplet ejection heads 17 is a so-called twin-type head, and includes a functional liquid introduction unit 91 having twin connecting needles 92, twin head boards 93 continuing from the functional liquid introduction unit 91, and a head body 94 continuing downwardly of the functional liquid introduction unit 91 and being formed with an in-head flow path filled with the functional liquid therein. The connecting needle 92 is connected to a functional liquid tank (not shown) and supplies the functional liquid to the functional liquid introduction unit 91. The head body 94 includes a cavity 95 (piezoelectric element), and a nozzle plate 96 having a nozzle surface 97 having a number of ejection nozzles 98 opening therethrough. When the functional liquid droplet ejection heads 17 are driven for ejection, a voltage is applied to the piezoelectric element and the functional liquid droplets are ejected from the ejection nozzles 98 by a pumping action of the cavities 95.

The number of ejection nozzles 98 formed on the nozzle surface 97 are arranged at uniform pitches, and two split nozzle rows 98b, each of which includes 180 ejection nozzles 98, are formed. The two sprint nozzle rows 98b are displaced by a half pitch from each other. That is, the two split nozzle rows 98b formed in the functional liquid droplet ejection heads 17 enable high-resolution printing.

As shown in FIG. 4, each of the carriage units 51 includes the carriage plate 53 which has the plurality of (12) functional liquid droplet ejection heads 17 arranged thereon. The 12 functional liquid droplet ejection heads 17 are divided in the Y-axis direction into two head groups 54 each of which has six functional liquid droplet ejection heads 17 aligned in the X-axis direction. All functional liquid droplet ejection heads 17 (12×10) included in the plurality of carriage units 51 form a printing line extending in the Y-axis direction. A length of the printing line corresponds to a width of a workpiece w having a maximum size capable of being mounted on the set table 21.

Each of the carriage units 51 includes a θ-rotation unit 61 which supports the carriage plate 53 and which performs a θ correction (θ rotation) on the carriage plate 53, and a hanging member 62 which supports the carriage plate 53 through the θ-rotation unit 61 so that the Y-axis table 12 (each of the bridge plates 52) supports the carriage plate 53. Note that, although not shown, a head elevation unit used for moving the carriage plate 53 upwardly and downwardly through the θ-rotation unit 61 is incorporated in the hanging member 62 so that a height of the carriage plate 53 (a height of the nozzle surface 97 of each of the functional liquid droplet ejection heads 17) is adjusted.

Figure 5:
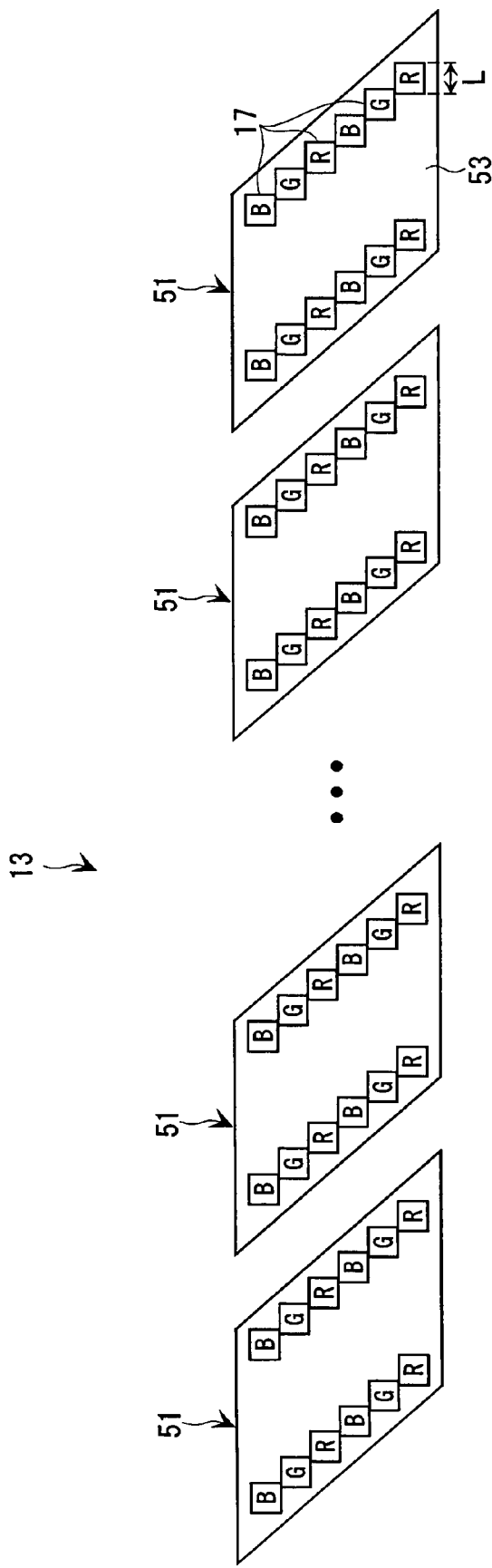
FIG. 5 is a diagram used for explaining a color scheme pattern of the functional liquid droplet ejection heads included in a head unit.

Each of the plurality of (12×10) functional liquid droplet ejection heads 17 included in the head unit 13 corresponds to one of three colors R, G, and B, and therefore, a printing pattern formed from the three color functional liquids can be printed on the workpiece W. FIG. 5 shows a diagram illustrating a color scheme pattern of the functional liquid droplet ejection heads 17 included in the head unit 13 according to this embodiment. The color scheme pattern of the functional liquid droplet ejection heads 17 is configured such that the three colors R, G, and B are assigned in a predetermined order (in an order of R, G, and B from the right side of FIG. 5 in this embodiment) to the 12×10 functional liquid droplet ejection heads 17 arranged in the Y-axis direction as shown in FIG. 4. Color scheme patterns among the ten carriage units 51 having the functional liquid droplet ejection heads 17 are the same.

Accordingly, when the head unit 13 moves in order to perform sub-scanning by a distance corresponding to a length of nozzle rows for two heads (160 nozzles), the functional liquid droplet ejection heads 17 for colors R, G, and B face an area where the third and later functional liquid droplet ejection heads 17 in a moving direction faced before the sub-scanning, and accordingly, a printing pattern using the three colors can be printed in this area.

Referring to FIG. 7, a case where a color filter of a liquid crystal display device is manufactured is taken as an example, and a series of operations in printing processing performed on a printing area of the liquid droplet ejection apparatus 1 will be described. Although described later in detail, a color filter 500 includes a substrate 501 having transparency (transparent substrate), a plurality of pixel areas (filter elements) 507a arranged on the workpiece W in a matrix in the X-axis direction and in the Y-axis direction, a coloring layer 508 using the three colors R, G, and B (508R, 508G, and 508B) arranged on the pixel areas 507a, and a light-shielding bank 503 used for partitioning each of the pixel areas 507a (refer to FIGS. 7 and 13). In the printing processing, the substrate 501 on which the bank 503 is formed is introduced as a workpiece W, and a predetermined printing pattern is printed on the workpiece W so that each of the pixel areas 507a receives functional liquids corresponding to the three colors R, G, and B ejected thereto.

Note that, as for a color scheme pattern of the color filter, a stripe arrangement, a mosaic arrangement, or a delta arrangement may be employed. The stripe arrangement is configured such that the pixel areas 507a have the same colors in the Y-axis direction for individual rows and have the three colors R, G, and B in the X-axis direction arranged in this order repeatedly. The mosaic arrangement is configured such that the pixel areas 507a are arranged so that three successive pixel areas 507a have different colors R, G, and B from one another in the X-axis direction and in the Y-axis direction. The delta arrangement is configured such that the rows of the plurality of pixel areas 507a are arranged so as to be displaced by half pitches from one another and three successive pixel areas 507a have colors different from one another. In this embodiment, a case where a color filter having the stripe arrangement is manufactured will be described (refer to FIG. 6).

The printing processing starts with a first printing operation, after the workpiece W moves from the alignment position 41 (the suction table 31). In the first printing operation, the X-axis table 11 is continuously driven and thereby the workpiece W on the set table 21 moves forward. In synchronization with this, the functional liquid droplet ejection heads 17 included in the head unit 13 which faces a home position are selectively driven to eject functional liquid onto the workpiece W (main scanning). When the forward movement of the workpiece W is completed, the Y-axis table 12 is driven, and the head unit 13 slightly moves in the Y-axis direction (sub-scanning). Then, the X-axis table 11 is driven again, and in synchronization with this, the functional liquid droplet ejection heads 17 are selectively driven again to eject the functional liquid onto the workpiece W moving backward. When the backward movement of the workpiece W is terminated, the Y-axis table 12 is driven again, the head unit 13 slightly moves in the Y-axis direction, and the series of the operations described above are repeated. The first printing operation is thus terminated. Note that, instead of the sub-scanning operation in which the head unit 13 slightly moves in the Y-axis direction in accordance with the movement of the Y-axis table 12, a sub-scanning operation in which a sub-Y-axis table (not shown) is disposed on the X-axis table 11 to slightly move the set table 21 in the Y-axis direction may be employed.

Figures 7A, 7B, 7C:
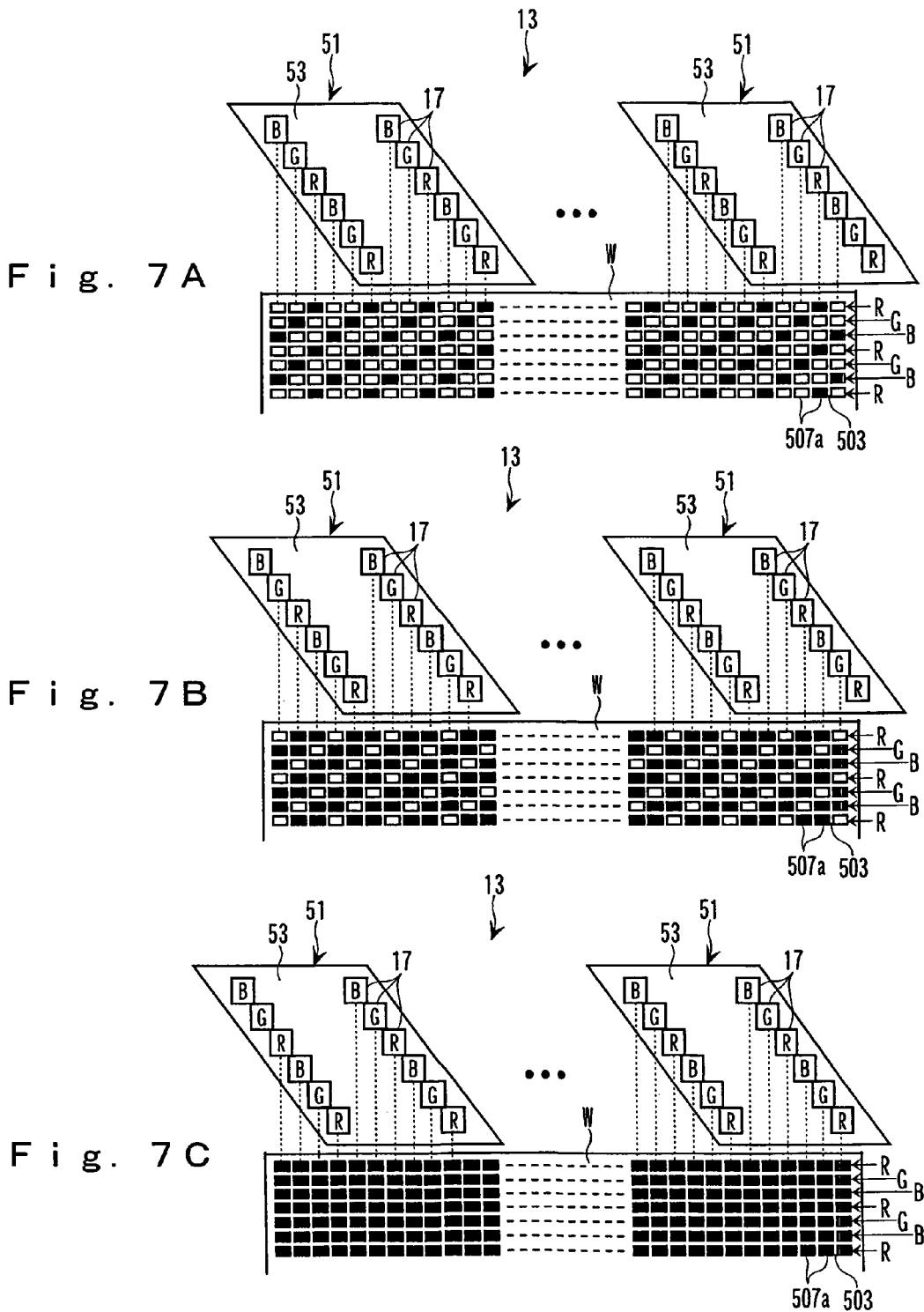
FIGS. 7A to 7C are plan views used for explaining printing processing using the liquid droplet ejection apparatus, in which FIG. 7A schematically illustrates a first printing operation, FIG. 7B schematically illustrates a second printing operation, and FIG. 7C schematically illustrates a third printing operation.

As shown in FIG. 7A, the printing line of the head unit 13 is arranged so as to intersect with columns of the pixel areas 507a arranged in a matrix so that the functional liquid droplet ejection heads 17 face the columns in each of the rows of the pixel areas 507a. When the head unit 13 faces the home position, two of the functional liquid droplet ejection heads 17 (corresponding to the colors R and G) arranged on the right side of the head unit 13 (on the left side of FIG. 1) are shifted out of the rightmost column of the pixel areas 507a to the right of FIG. 7A. When the first printing operation is performed, all the functional liquid droplet ejection heads 17 face the columns of the pixel areas 507a, and each of the functional liquid droplet ejection heads 17 ejects the functional liquid to a corresponding one of the pixel areas 507a having a color the same as that of the functional liquid droplet ejection head 17.

When the first printing operation is terminated, the Y-axis table 12 is driven so that the head unit 13 moves in the Y-axis direction approximately by a length of one head nozzle row L. Accordingly, the functional liquid droplet ejection heads 17 corresponding to the color B face positions where the functional liquid droplet ejection heads 17 corresponding to the color R faced in the first printing operation, the functional liquid droplet ejection heads 17 corresponding to the color R face positions where the functional liquid droplet ejection heads 17 corresponding to the color G faced in the first printing operation, and the functional liquid droplet ejection heads 17 corresponding to the color G face positions where the functional liquid droplet ejection heads 17 corresponding to the color B faced in the first printing operation. Subsequently, a second printing operation is performed. As with the first printing operation, the reciprocating motion of the workpiece W and the driving operation for ejection of the functional liquid droplet ejection heads 17 are performed twice. As shown in FIG. 7B, by this operation, the functional liquid having the color B is ejected onto each of the columns of the pixel areas 507a where the functional liquid having the color R was previously ejected, the functional liquid having the color R is ejected onto each of the columns of the pixel areas where the functional liquid having the color G was previously ejected, and the functional liquid having the color G is ejected onto each of the columns of the pixel areas where the functional liquid having the color B was previously ejected.

When the second printing operation is terminated, the Y-axis table 12 is driven so that the head unit 13 further moves in the Y-axis direction approximately by a length of one head nozzle row L. Accordingly, the functional liquid droplet ejection heads 17 corresponding to the color G face positions where the functional liquid droplet ejection heads 17 corresponding to the color R faced in the first printing operation, the functional liquid droplet ejection heads 17 corresponding to the color B face positions where the functional liquid droplet ejection heads 17 corresponding to the color G faced in the first printing operation, and the functional liquid droplet ejection heads 17 corresponding to the color R face positions where the functional liquid-droplet ejection heads 17 corresponding to the color B faced in the first printing operation. Subsequently, a third printing operation is performed. As with the first and second printing operations, the reciprocating motion of the workpiece W is performed twice. Accordingly, each of the rows of the pixel areas 507a receives the functional liquid of each of all the three colors R, G, and B, and the printing processing performed on the workpiece W is terminated. Note that, when the printing processing is terminated, two of the functional liquid droplet ejection heads 17 (corresponding to the colors G and B) located on the left side of the head unit 13 (on the right side of FIG. 1) are shifted out of the leftmost column of the pixel areas 507a to the left shown in FIG. 7C.

As described above, in this embodiment, since the 12×10 functional liquid droplet ejection heads 17 arranged in the Y-axis direction have a color scheme pattern in which the three different colors R, G, and B are repeatedly ejected, each of the pixel areas 507a on the workpiece W receives the functional liquids of all colors R, G, and B only by moving the head unit 13 by a length of the nozzle rows for two heads (2L). Furthermore, since the functional liquids of the three colors R, G, and B are not ejected simultaneously onto the pixel areas 507a arranged in the same column (also onto the pixel areas 507a arranged in the same row in a case of a stripe arrangement), even when a functional liquid is attached onto the bank 503 due to flight deflection, colors are not mixed up since the functional liquid ejected on the bank 503 dries with time. Consequently, a color filter may be manufactured with high accuracy.

In this embodiment, although the printing processing is performed by performing the reciprocating motion of the head unit 13 twice, the number of times the reciprocating motion is performed is arbitrarily but reasonably determined.

The flushing unit 14, the suction unit 15, the wiping unit 16, and the ejection function inspection unit 18 which constitute the maintenance unit will now be described in this order. The flushing unit 14 is used to receive the functional liquid droplets ejected as forcible ejection (flushing) from all the ejection nozzles 98 of the functional liquid droplet ejection heads 17. The flushing unit 14 includes the pre-printing flushing unit 111 and a periodic flushing unit 112.

The pre-printing flushing unit 111 is used to receive functional liquid ejected at a time of pre-printing flushing which is performed by driving all the functional liquid droplet ejection heads 17 of the head unit 13 immediately before the functional liquid is ejected onto the workpiece W. The pre-printing flushing unit 111 includes the pair of pre-printing flushing boxes 121 which receive the functional liquid, and a pair of box supporting members (not shown) used so that the pair of pre-printing flushing boxes 121 are supported by the suction table 31 (a supporting base, not shown) (refer to FIGS. 1 and 2). Each of the pre-printing flushing boxes 121 has an elongated box shape, that is, a rectangular shape in plan view having long sides in the Y-axis direction. Each of the pre-printing flushing boxes 121 has an absorber which absorbs the functional liquid on the bottom surface thereof.

The pair of box supporting members support the pre-printing flushing boxes 121 while extending beyond the suction table 31 so that the pre-printing flushing boxes 121 are disposed along a pair of sides (peripheral edges) of the suction table 31 which are parallel to the Y-axis direction. That is, the pre-printing flushing boxes 121 are disposed so as to sandwich the suction table 31 from the front and back sides. When the workpiece W moves back and forth in the X-axis direction, the functional liquid droplet ejection heads 17 of the head unit 13 sequentially face the pre-printing flushing boxes 121 immediately before facing the workpiece W so as to perform the pre-printing flushing. Accordingly, the functional liquid droplet ejection heads 17 stably eject functional liquid and the printing processing is performed on the workpiece W with high accuracy.

Figure 8:
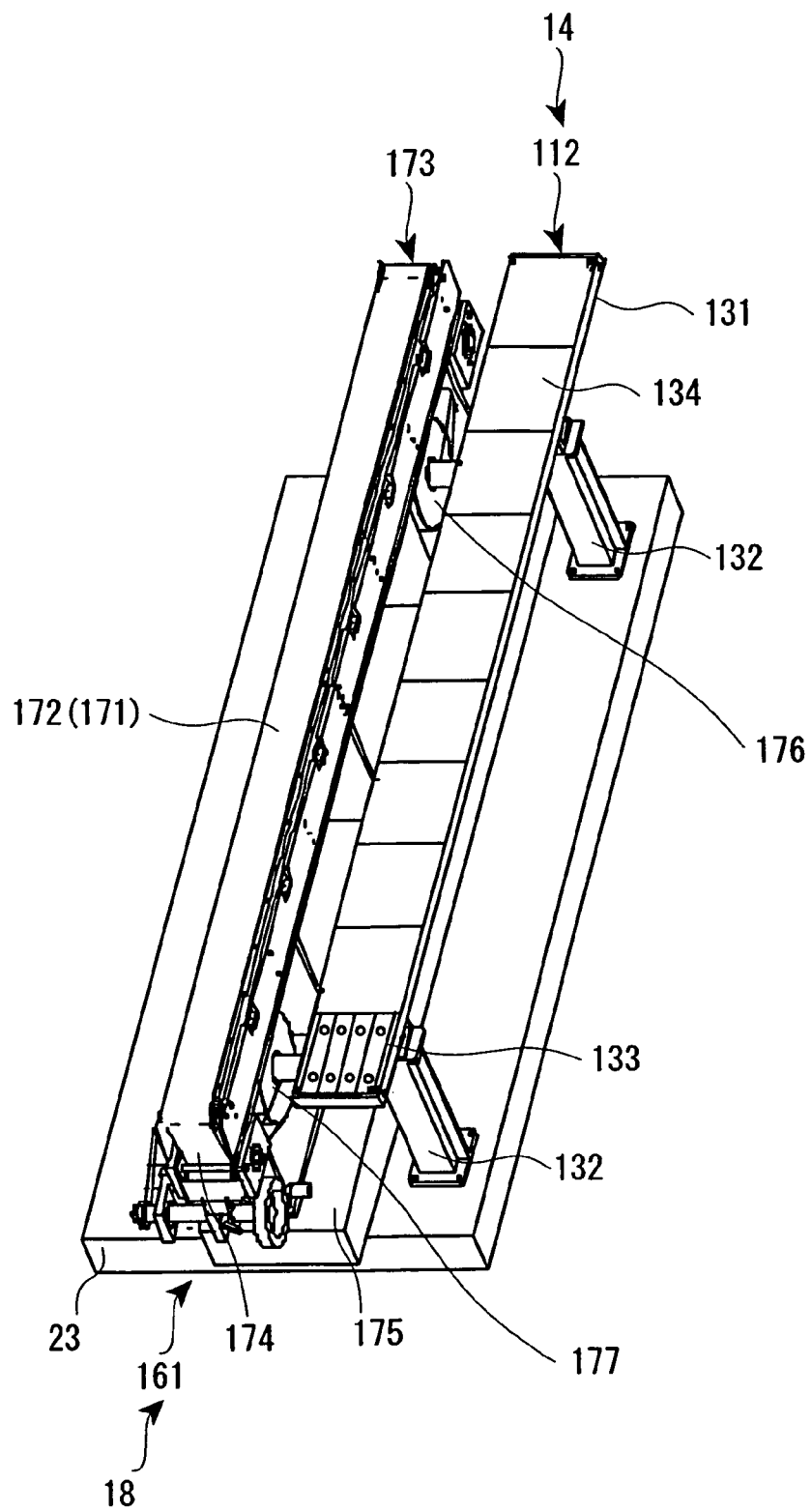
FIG. 8 is a perspective view of a second slider and other components disposed near the second slider.

As shown in FIGS. 1, 2, and 8, the periodic flushing unit 112 is used to receive functional liquid ejected at the time of periodic flushing performed by driving the functional liquid droplet ejection heads 17 of the head unit 13 when the printing process is temporarily stopped, for example, during a replacement operation of the workpiece W. The periodic flushing unit 112 includes a periodic flushing box 131 which receives the functional liquid and a pair of box support rods 132 mounted on the X-axis second slider 23. The box support rods 132 support both ends of the periodic flushing box 131 so that the height of the periodic flushing box 131 is adjustable.

The periodic flushing box 131 is an open-topped box with a rectangular shape having long sides in the Y-axis direction in plan view. The periodic flushing box 131 has a size that can contain all the 12×10 functional liquid droplet ejection heads 17 included in the head unit 13. The periodic flushing box 131 allows all the functional liquid droplet ejection heads 17 to perform periodic flushing simultaneously. A plurality of ribs 133 (three ribs) are arranged to protrude from the bottom surface of the periodic flushing box 131 while extending in the Y-axis direction. Absorbent material sheets 134 for absorbing the functional liquid are arranged on the ribs 133. The top surfaces of the absorbent material sheet 134 substantially coincide with the top surface of the periodic flushing box 131. When the X-axis second slider 23 moves so that the suction table 31 faces the mount position or the workpiece W, the periodic flushing box 131 faces the head unit 13 so as to receive the functional liquid ejected at the time of the periodic flushing.

The suction unit 15 sucks the functional liquid droplet ejection heads 17 to force the ejection nozzles 98 of the functional liquid droplet ejection heads 17 to eject functional liquid. As shown in FIG. 1, the suction unit 15 is configured so as to correspond to the head unit 13, that is, the ten carriage units 51, and ten divided suction units 141 having a configuration the same as that of the suction unit 15 are aligned on the mount 6. Each of the divided suction units 141 includes a cap unit 142, a cap elevation mechanism (not shown) and a sucking unit (ejector, not shown). The cap unit 142 faces the bottom surfaces of the carriage units 51 to be sucked and causes 12 caps 143 to be brought into tight contact with the nozzle surfaces 97 of the respective 12 functional liquid droplet ejection heads 17 mounted on the carriage units 51. The cap elevation mechanism moves the cap unit 142 up and down to allow the cap 143 to move towards and away from the functional liquid droplet ejection heads 17 (the nozzle surface 97). The sucking unit sucks the functional liquid droplet ejection heads 17 via the caps 143 which are in tight contact with the nozzle surface 97 of the functional liquid droplet ejection heads 17.

The functional liquid is sucked in order to recover or prevent clogging of the functional liquid droplet ejection heads 17 (the ejection nozzles 98). In addition, the functional liquid is sucked in order to fill functional liquid flow channels extending from the functional liquid tank to the functional liquid droplet ejection heads 17 with the functional liquid when a new liquid droplet ejection apparatus 1 is installed or when one of the functional liquid droplet ejection heads 17 is replaced with a new one. Furthermore, the caps 143 included in the suction unit 15 are used to maintain the functional liquid droplet ejection heads 17 when the liquid droplet ejection apparatus 1 is not in use. In this case, the head unit 13 faces the suction unit 15 and the caps 143 are brought into tight contact with the nozzle surfaces 97 of the functional liquid droplet ejection heads 17. Thus, the nozzle surfaces 97 are sealed so as to prevent the functional liquid droplet ejection heads 17 (the ejection nozzles 98) from drying out.

The wiping unit 16 wipes the nozzle surfaces 97 of the functional liquid droplet ejection heads 17 using a wiping sheet 151 to which cleaning liquid has been sprayed. The wiping unit 16 includes a take-up unit 152 for feeding the wiping sheet 151 wound as a roll and reeling the fed wiping sheet 151, a cleaning liquid supplying unit 153 for spraying cleaning liquid to the fed wiping sheet 151, and a wiping unit 154 for wiping the nozzle surfaces 97 using the wiping sheet 151 on which the cleaning liquid has been sprayed (refer to FIG. 1). The wiping operation is performed after the suction unit 15 performs the sucking operation, so that dust and dirt deposited on the nozzle surfaces 97 are wiped out. The wiping unit 16 is arranged at a position closer to the X-axis table 11 than the suction unit 15. The wiping unit 16 faces the head unit 13 (each of the carriage units 51) returning to the home position after the sucking operation using the suction unit 15 so that the wiping unit 16 efficiently performs the wiping operation.

As shown in FIGS. 1, 2, and 8, the ejection function inspection unit 18 is used to determine whether the ejection nozzles 98 of the functional liquid droplet ejection heads 17 disposed on the head unit 13 properly eject the functional liquid. The ejection function inspection unit 18 includes a printing unit 161 which receives the functional liquid ejected from the ejection nozzles 98 of the functional liquid droplet ejection heads 17 of the head unit 13 for inspection and to which a predetermined inspection pattern is printed, and an imaging unit 162 which captures and checks the inspection pattern printed on the printing unit 161. Note that the printing unit 161 is mounted on the X-axis table 11, and the imaging unit 162 is fixedly disposed on the inspection position located immediately under the Y-axis table 12. Note that inspection cameras 181, which will be described later, are movable.

Figure 9:
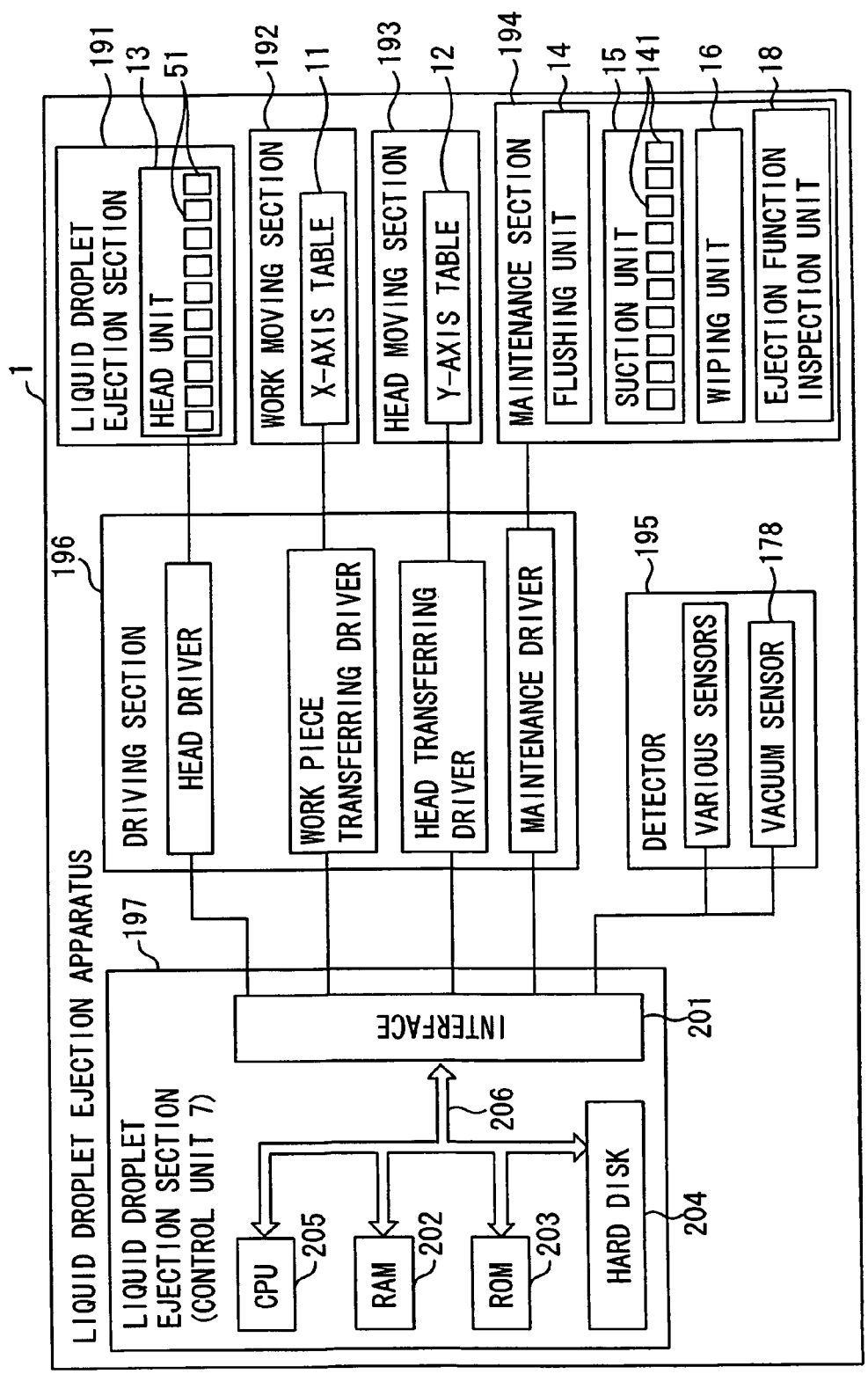
FIG. 9 is a block diagram illustrating a main control system of a printing apparatus.

The printing unit 161 includes a printing sheet 171 (such as roll paper), an inspection stage 172, a sheet feeder 173, a sheet feeder supporting member 174, a unit base 175, and a vacuum sensor 178 shown in FIG. 9. The printing sheet 171 receives the functional liquid ejected from the functional liquid droplet ejection heads 17 at the time of the inspection ejection and is wound as a roll so that an inspection pattern may be printed thereon. The printing sheet 171 is mounted on the inspection stage 172. The sheet feeder 173 is used to feed a portion of the printing sheet 171 which has been inspected out of the inspection stage 172, and feed a portion of the printing sheet 171 which has yet to be inspected into the inspection stage 172. The sheet feeder 173 is supported by the sheet feeder supporting member 174, and the sheet feeder supporting member 174 is supported by the unit base 175. The vacuum sensor 178 checks whether the printing sheet 171 is properly set on the inspection stage 172. Furthermore, the sheet feeder 173 includes a feeding reel 176 used to feed the printing sheet 171, a take-up reel 177 used to take up the fed printing sheet 171, and a reeling motor (geared motor, not shown) used to rotate the take-up reel 177. The fed printing sheet 171 horizontally moves in the Y-axis direction while being exposed to the outside, and is then taken up by the take-up reel 177. A portion of the printing sheet 171 which successively moves horizontally (hereinafter referred to as a "horizontal moving portion") is a printed portion on which the inspection pattern is printed. The length of the long sides of the horizontal moving portion which extends in the Y-axis direction is set so that the horizontal moving portion can receive the functional liquid ejected from all the functional liquid droplet ejection heads 17 included in the head unit 13 at the time of inspection ejection. In this embodiment, as with the pre-printing flushing boxes 121 and the periodic flushing box 131, the length of the long sides is set so as to correspond to a length of one printing line plus the nozzle row length for two heads.

As shown in FIG. 2, the imaging unit 162 is supported by the Y-axis supporting bases 3. The imaging unit 162 includes the two inspection cameras 181, a camera holder 182, a camera moving unit 183, and a camera moving motor (not shown). The inspection cameras 181 face the X-axis table 11 from above, are used to capture the inspection pattern printed on the printing sheet 171, and are held by the camera holder 182. The camera moving unit 183 is fixed to the Y-axis supporting bases 3, and is used to support, through the camera holder 182, the two inspection cameras 181 which are slidable in the Y-axis direction. The camera moving motor is used to move the inspection cameras 181 in the Y-axis direction through the camera moving unit 183. The two inspection cameras 181 each capture an image of half the inspection pattern (hereinafter referred to as a "half image") printed on the printing sheet 171. For example, the two inspection cameras 181 are arranged so as to have a distance therebetween corresponding to a half length of one printing line of the head unit 13. In this state, the two inspection cameras 181 are moved so that the left one of the inspection cameras 181 captures a left half image of the inspection pattern and the right one of the inspection cameras 181 captures a right half image of the inspection pattern. In this way, the inspection pattern is effectively captured (scanned) in only a short time. Consequently, time required for the ejection function inspection of the functional liquid droplet ejection heads 17 can be reduced.

The imaging unit 162 is disposed such that when the suction table 31 faces the workpiece mount position, the two inspection cameras 181 face the printing sheet 171. In this embodiment, the inspection pattern is captured while the workpiece is replaced or while the workpiece is aligned. A result of the capturing using the two inspection cameras 181 is sent to the control unit 7 to be recognized as an image, and in accordance with the recognized image, it is determined whether the ejection nozzles 98 of the functional liquid droplet ejection heads 17 properly eject the functional liquid (that is, whether the clogging of each of the ejection nozzles 98 is found). This determination can also be made while the workpiece is replaced or while the workpiece is aligned. That is, the ejection inspection unit is constituted by the imaging unit 162 and the control unit 7.

The vacuum sensor 178 is disposed between the suction table 31 and a suction pipe (not shown) connected to an air suction unit (not shown). The vacuum sensor 178 is used to detect a portion of the printing sheet 171 having a negative pressure smaller than a predetermined negative pressure (a portion where the absolute value of a negative pressure is small). Accordingly, a portion of the printing sheet 171 having a gap between itself and the suction table 31 due to an absorption defect can be detected.

A result of the detection is sent to the control unit 7, and the control unit 7 stops driving the ejection function inspection unit 18. This prevents the printing sheet 171 from contacting the nozzle surface 97 of the functional liquid droplet ejection heads 17. Note that the inspection stage 172 may be divided into a plurality of blocks in a longitudinal direction and a plurality of vacuum sensors 178 may be provided for the individual blocks. In this embodiment, the printing processing for the workpiece w and the detection of the improper setting of the printing sheet 171 using the vacuum sensor 178 are simultaneously performed, which will be described later in detail.

Note that, instead of the vacuum sensor 178, displacement sensors (used to detect a gap between the printing sheet 171 and the suction table 31 at a plurality of positions) may be disposed in a retracted position so as to face the printing unit 161 from above in order to detect improper setting of the printing sheet 171. Furthermore, laser sensors (used to determine whether a laser beam is shielded by the printing sheet 171 at a plurality of positions) may be disposed in the retracted position so as to laterally face the printing unit 161 in order to detect improper setting of the printing sheet 171.

Referring to FIG. 9, a main control system of the liquid droplet ejection apparatus 1 will be described. As shown in FIG. 9, the liquid droplet ejection apparatus 1 includes a liquid droplet ejection section 191, a workpiece moving section 192, a head moving section 193, a maintenance section 194, a detector 195, a driving section 196, and a controller 197 (the control unit 7). The liquid droplet ejection section 191 includes the head unit 13 (the functional liquid droplet ejection heads 17). The workpiece moving section 192 includes the X-axis table 11 and is used to move the workpiece W in the X-axis direction. The head moving section 193 includes the Y-axis table 12 and is used to move the head unit 13 in the Y-axis direction. The maintenance section 194 includes units used for maintenance. The detector 195 includes various sensors used for various detection operations. The driving unit 196 includes various drivers which control and drive these individual sections. The controller 197 is connected to the individual sections and entirely controls the liquid droplet ejection apparatus 1.

The controller 197 includes various components such as an interface 201, a RAM 202, a ROM 203, a hard disk 204, a CPU 205, and a bus 206. The interface 201 is used to connect the various units to each other. The RAM 202 has a storage area capable of storing data temporarily and is used as a workspace for control processing. The ROM 203 has various storage areas and is used to store control programs and control data. The hard disk 204 stores printing data used when a predetermined printing pattern is printed onto the workpiece W and a variety of data transmitted from the various units, and further stores programs used for processing the variety of data. The CPU 205 performs calculation processing for the variety of data in accordance with the programs stored in the ROM 203 and the hard disk 204. The bus 206 is used to connect the components to each other.

The controller 197 is used to input the variety of data transmitted from the various units through the interface 201 and allows the CPU 205 to perform the calculation processing in accordance with the programs stored in the hard disk 204 (or in accordance with the programs read from the ROM 203 using a CD-ROM drive, for example). A result of the calculation processing is output to the units through the driving section 196 (the various drivers). Thus, the liquid droplet ejection apparatus 1 is entirely controlled and various operations of the liquid droplet ejection apparatus 1 are performed.

Referring to a flowchart shown in FIG. 10 and an explanatory diagram shown in FIGS. 11A to 11H, a procedure of the printing processing performed on the workpiece W and a procedure of the ejection function inspection operation performed on the functional liquid droplet ejection heads 17 will be described. First, a workpiece W that has yet to be processed is mounted on the set table 21 (the suction table 31) which faces the alignment position 41 for the workpiece W and which is disposed over the X-axis first slider 22 using the robot arm 71 (workpiece replacement section). This process is hereinafter referred to as a "replacement processing". Simultaneously, the controller 197 controls the printing unit 161 disposed on the X-axis second slider 23 to move to an inspection position which faces the inspection cameras 181. The inspection cameras 181 capture an inspection pattern formed by ejecting functional liquid using the functional liquid droplet ejection heads 17 on the printing sheet 171 located onto the printing unit 161 to generate image data to be read (in step S1 of FIG. 10 and FIG. 11A).

Then, the controller 197 drives the workpiece alignment camera 42. The workpiece alignment camera 42 captures a position of the workpiece W mounted on the set table 21 located over the X-axis first slider 22 and recognizes a capturing result as an image. In accordance with the recognized image, the controller 197 drives the X-axis first slider 22, the Y-axis sliders, and the θ table 32 so that the alignment processing is performed in the X, Y, and θ directions. (Data correction processing may be performed in the X and Y directions.) Meanwhile, in the printing unit 161, the inspection cameras 181 controlled by the controller 197 further capture the inspection pattern formed by ejecting the functional liquid onto the printing sheet 171 for inspection to generate image data, and reads the image data of the inspection pattern (in step S2 of FIG. 10 and FIG. 11B).

At this time, the replacement processing and the alignment processing performed on the workpiece W and the ejection function inspection processing of the functional liquid droplet ejection heads 17 can be simultaneously performed. That is, the ejection function inspection processing can be efficiently performed while the replacement processing and the alignment processing are performed on the workpiece W. Accordingly, tact time for processing the workpiece W can be reduced, and hence, the productivity of the workpiece W can be improved.

Although not shown in FIGS. 10 and 11A to 11H, when the printing unit 161 arranged on the X-axis second slider 23 moves to the inspection position so as to face the inspection cameras 181, the periodic flushing unit 112 (the periodic flushing box 131) disposed on the same X-axis second slider 23 moves to a position where the periodic flushing unit 112 faces the functional liquid droplet ejection heads 17. In this state, the periodic flushing unit 112 enters a waiting state until the next printing processing while receiving forcible ejection from the functional liquid droplet ejection heads 17 on the periodic flushing box 131. Since the periodic flushing box 131 is disposed on the X-axis second slider 23, transition time required for changing states from a waiting state to a state of printing processing may be reduced, and accordingly, this makes it possible to effectively prevent the ejection nozzles 98 from drying out.

Figure 10:
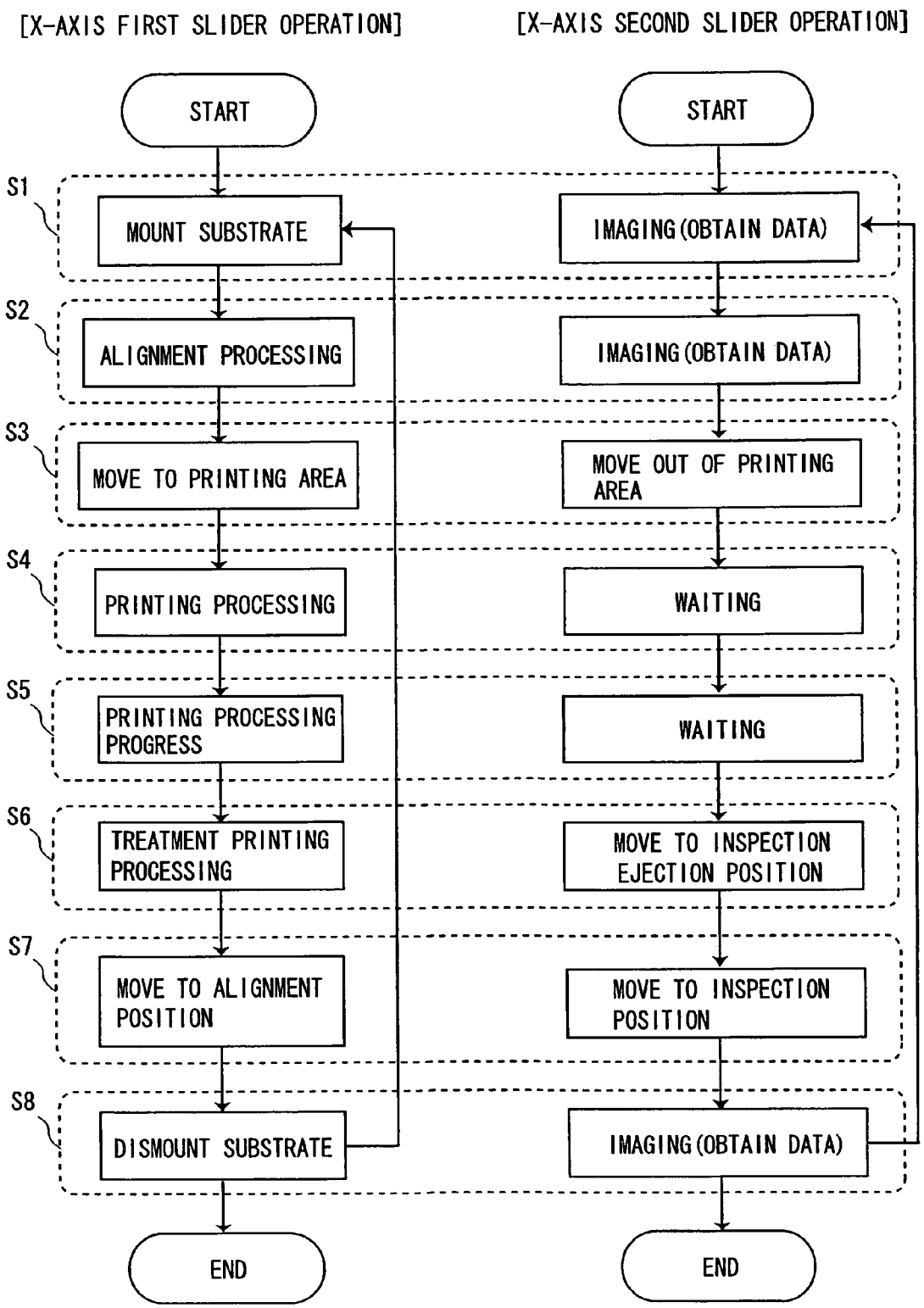
FIG. 10 is a flowchart illustrating printing processing steps and ejection performance inspection steps performed simultaneously.
Figure 11A:
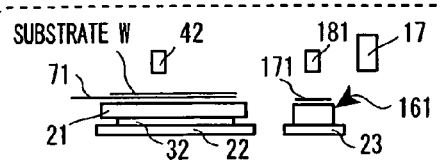
FIGS. 11A to 11H are process charts illustrating printing processing steps and ejection performance inspection steps performed simultaneously.
Figure 11B:
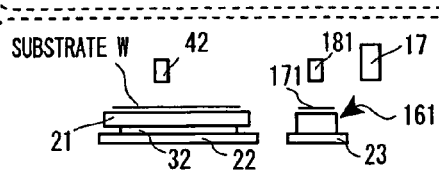
Figure 11C:
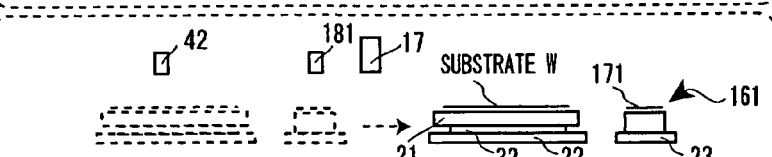
Figure 11D:
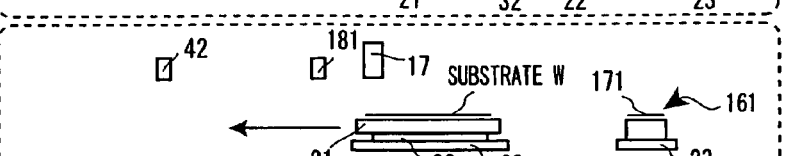
Figure 11E:
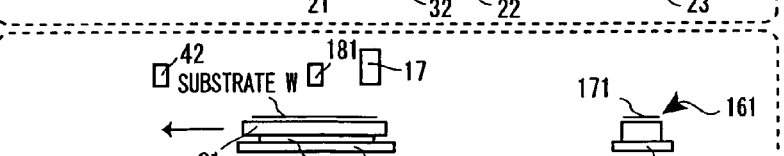

After the alignment processing performed on the workpiece W and the ejection function inspection processing of the functional liquid droplet ejection heads 17 are completed, the controller 197 controls the X-axis first slider 22 to slide in a scanning direction so that the set table 21 and the workpiece W move to the printing area, and to slide the X-axis second slider 23 in the scanning direction so that the printing unit 161 moves to a retracted position, that is, the home position of the printing unit 161 (refer to step S3 of FIG. 10 and FIG. 11C).

The set table 21 which moved to the printing area performs reciprocating motion relative to the functional liquid droplet ejection heads 17, and in synchronization with this, the functional liquid droplet ejection heads 17 are driven to start performing the printing processing on the workpiece W. The printing unit 161 does not need to move and waits in the retracted position (refer to step S4 of FIG. 10 and FIG. 11D). The printing unit 161 keeps waiting in the retracted position while the functional liquid droplet ejection heads 17 perform the printing processing on the workpiece W on the set table 21 (refer to step S5 of FIG. 10 and FIG. 11E).

In this case, as described above, since the periodic flushing unit 112 (periodic flushing box 131) is disposed on the X-axis second slider 23, the weight of the components disposed on the X-axis first slider 22 to be moved is reduced resulting in improvement of response at a time of a feeding operation in the printing processing.

Furthermore, since the printing processing performed on the workpiece W, the feeding operation of the printing sheet 171 and the detection of the improper setting of the printing sheet 171 after the feeding operation are simultaneously performed while the printing unit 161 is positioned in the retracted position which is outside the printing area, the feeding operation of the printing sheet 171 and the detection of improper setting of the printing sheet 171 can be efficiently performed by making use of the time required for the printing processing. Moreover, since the printing unit 161 moves to the retracted position so as to have a predetermined distance between itself and the printing area and the set table 21, paper scraps and dust generated due to the feeding operation of the printing sheet 171 do not become attached to the functional liquid droplet ejection heads 17 and the workpiece W mounted on the set table 21. Accordingly, the functional liquid droplet ejection heads 17 and the workpiece W can be kept clean.

Figure 11F:
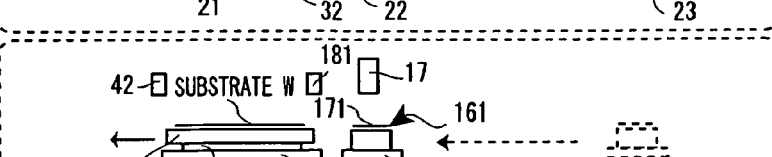
Figure 11G:
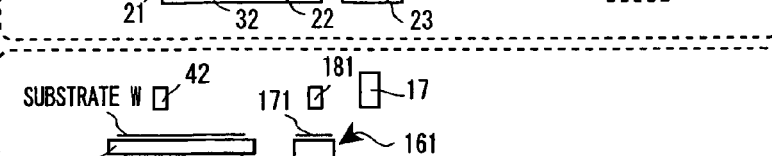
Figure 11H:
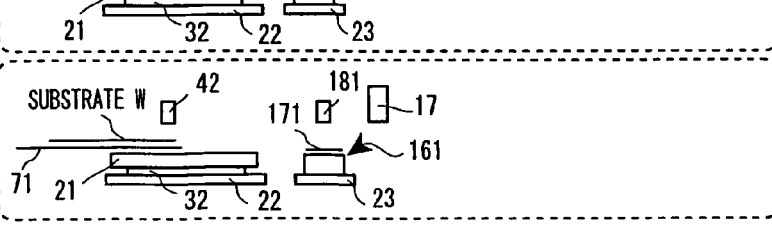

When the printing processing performed on the workpiece W mounted on the set table 21 is terminated, the controller 197 controls the printing unit 161 disposed on the X-axis second slider 23 to move to a position where the printing unit 161 faces the functional liquid droplet ejection heads 17 so that the functional liquid droplet ejection heads 17 can eject the functional liquid onto the printing sheet 171 for inspection (refer to step S6 of FIG. 10 and FIG. 11F). Thereafter, the controller 197 controls the X-axis first slider 22 to slide to the alignment position 41 so that the set table 21 faces the workpiece alignment camera 42. In addition, the controller 197 controls the X-axis second slider 23 to slide to the inspection position so that the printing unit 161 faces the inspection cameras 181 (refer to step S7 of FIG. 10 and FIG. 11G).

Then, the workpiece W on the set table 21 which has been subjected to the printing processing is dismounted (the replacement processing) using the robot arm 71, and simultaneously, the controller 197 controls the inspection cameras 181 to be driven. The inspection cameras 181 capture the inspection pattern printed on the printing sheet 171 mounted on the printing unit 161 to generate inspection pattern data to be read (refer to step S8 of FIG. 10 and FIG. 11H). Thereafter, the process returns to step S1 of FIG. 10 and the printing processing is restarted.

As described above, according to the liquid droplet ejection apparatus 1 of this embodiment, the replacement processing and the alignment processing performed on the workpiece W and the inspection processing can be substantially simultaneously performed. Therefore, the ejection function inspection processing can be performed by making use of the time required for the replacement processing and the alignment processing performed on the workpiece W. Accordingly, tact time for processing the workpiece W can be reduced resulting in improvement of the productivity of the workpiece W.

Furthermore, according to the liquid droplet ejection apparatus 1 of this embodiment, since the feeding operation of the printing sheet 171 which receives inspection ejection of the functional liquid from the functional liquid droplet ejection heads 17 is performed in the retracted position, paper scraps and dust generated due to the feeding operation do not become attached to the functional liquid droplet ejection heads 17 and the workpiece w. Accordingly, the printing processing is performed while the functional liquid droplet ejection heads 17 and the workpiece W are kept clean. Moreover, since the feeding operation of the printing sheet 171 and the detection of improper setting of the printing sheet 171 can be performed by making use of the time required for the printing processing performed on the workpiece W, the tact time for processing the workpiece W may be reduced resulting in improvement of the productivity of the workpiece W.

Taking electro-optical apparatuses (flat panel display apparatuses) manufactured using the liquid droplet ejection apparatus 1 and active matrix substrates formed on the electro-optical apparatuses as display apparatuses as examples, configurations and manufacturing methods thereof will now be described. Examples of the electro-optical apparatuses include a color filter, a liquid crystal display apparatus, an organic EL apparatus, a plasma display apparatus (PDP (plasma display panel) apparatus), and an electron emission apparatus (FED (field emission display) apparatus and SED (surface-conduction electron emitter display) apparatus). Note that the active matrix substrate includes thin-film transistors, source lines and data lines which are electrically connected to the thin film transistors.

Figure 12:
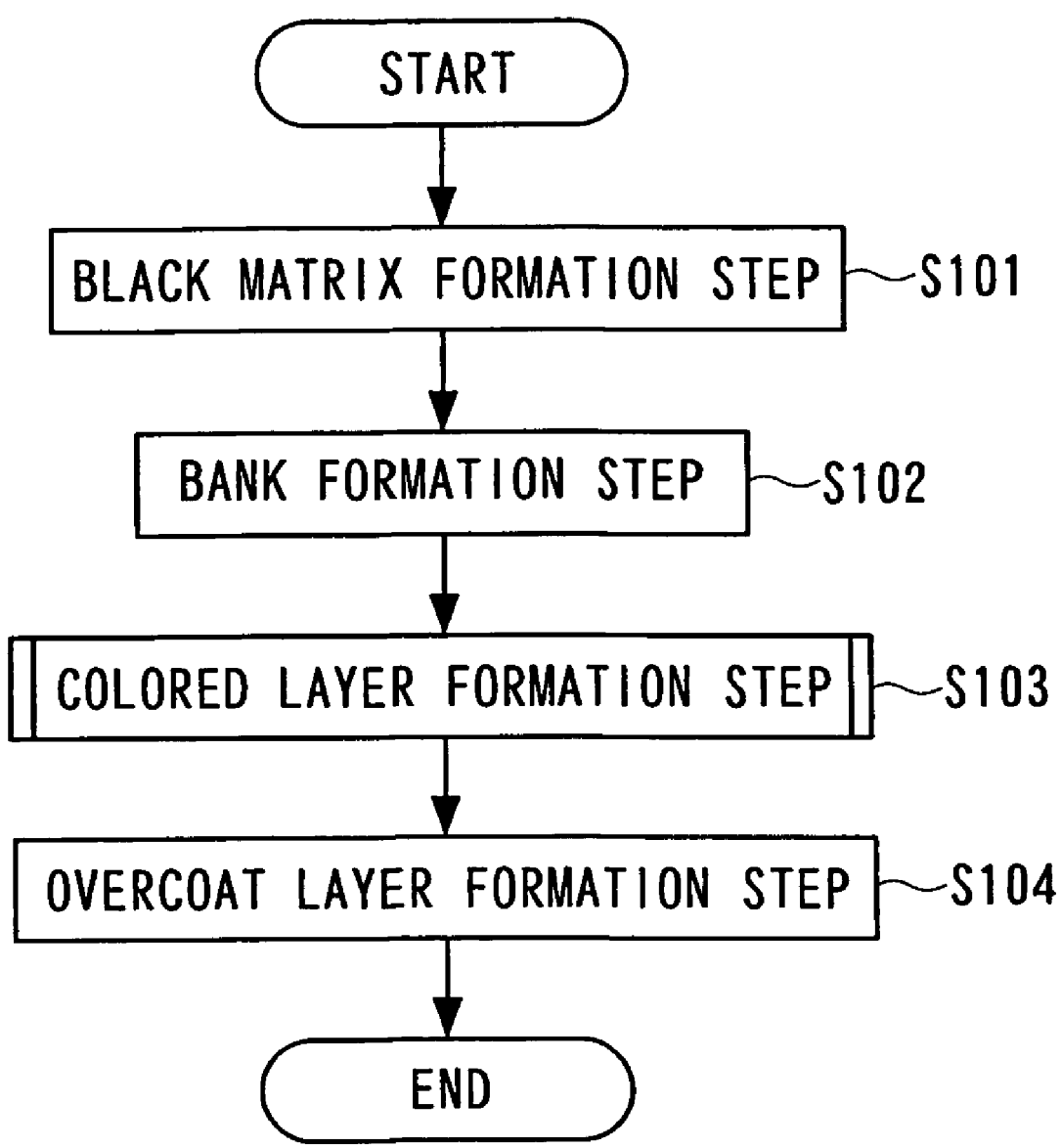
FIG. 12 is a flow chart illustrating manufacturing steps of the color filter.

First, a manufacturing method of a color filter incorporated in a liquid crystal display apparatus or an organic EL apparatus will be described. FIG. 12 shows a flowchart illustrating manufacturing steps of a color filter. FIGS. 13A to 13E are sectional views of the color filter 500 (a filter substrate 500A) of this embodiment shown in an order of the manufacturing steps.

Figure 13A:
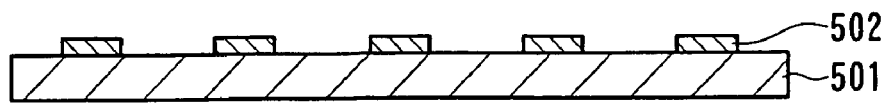
FIGS. 13A to 13E are sectional views schematically illustrating the color filter showing in an order of manufacturing steps.

In a black matrix forming step (step S101), as shown in FIG. 13A, a black matrix 502 is formed on the substrate (W) 501. The black matrix 502 is formed of a chromium metal, a laminated body of a chromium metal and a chromium oxide, or a resin black, for example. The black matrix 502 may be formed of a thin metal film by a sputtering method or a vapor deposition method. Alternatively, the black matrix 502 may be formed of a thin resin film by a gravure printing method, a photoresist method, or a thermal transfer method.

Figure 13B:
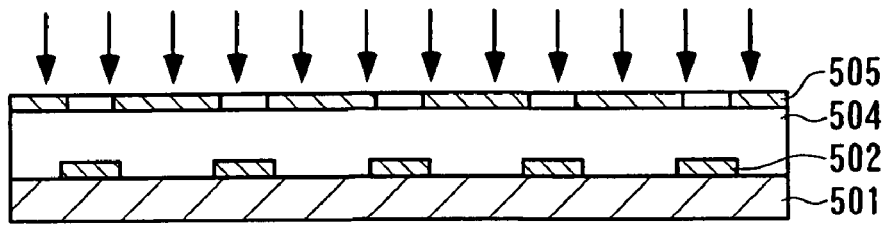

In a bank forming step (step S102), the bank 503 is formed so as to be superposed on the black matrix 502. Specifically, as shown in FIG. 13B, a resist layer 504 which is formed of a transparent negative photosensitive resin is formed so as to cover the substrate 501 and the black matrix 502. An upper surface of the resist layer 504 is covered with a mask film 505 formed in a matrix pattern. In this state, exposure processing is performed.

Figure 13C:
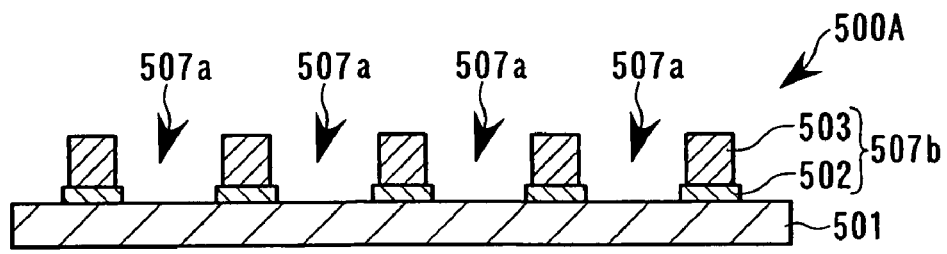

Furthermore, as shown in FIG. 13C, the resist layer 504 is patterned by performing etching processing on portions of the resist layer 504 which are not exposed, and the bank 503 is thus formed. Note that when the black matrix 502 is formed of a resin black, the black matrix 502 also serves as a bank.

The bank 503 and the black matrix 502 disposed beneath the bank 503 serve as a partition wall 507b for partitioning the pixel areas 507a. The partition wall 507b defines receiving areas for receiving the functional liquid ejected when the functional liquid droplet ejection heads 17 form coloring layers (film portions) 508R, 508G, and 508B in a subsequent coloring layer forming step.

The filter substrate 500A is obtained through the black matrix forming step and the bank forming step.

Note that, in this embodiment, a resin material having a lyophobic (hydrophobic) film surface is used as a material of the bank 503. Since a surface of the substrate (glass substrate) 501 is lyophilic (hydrophilic), variation of positions to which the liquid droplet is projected in the each of the pixel areas 507a surrounded by the bank 503 (partition wall 507b) can be automatically corrected in the subsequent coloring layer forming step.

Figure 13D:
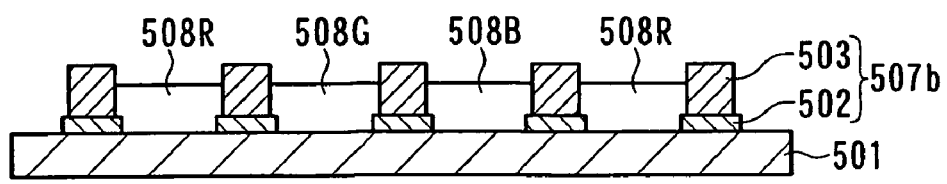

In the coloring layer forming step (S103), as shown in FIG. 13D, the functional liquid droplet ejection heads 17 eject the functional liquid within the pixel areas 507a each of which are surrounded by the partition wall 507b. In this case, the functional liquid droplet ejection heads 17 eject functional liquid droplets using functional liquids (filter materials) of colors R, G, and B. A color scheme pattern of the three colors R, G, and B may be the stripe arrangement, the mosaic arrangement, or the delta arrangement.

Figure 13E:
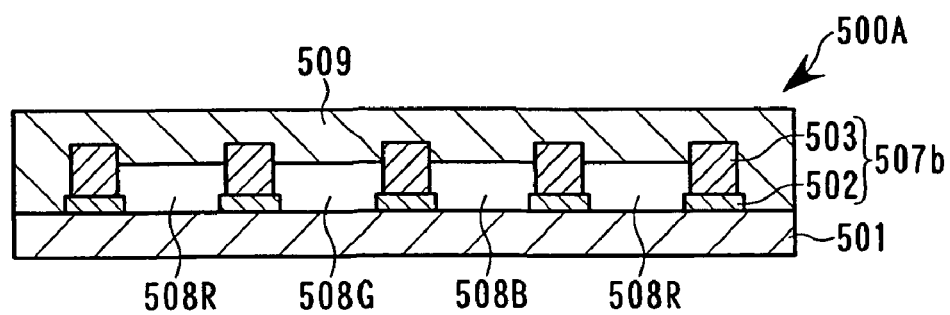

Then drying processing (such as heat treatment) is performed so that the three color functional liquids are fixed, and thus three coloring layers 508R, 508G, and 508B are formed. Thereafter, a protective film forming step is reached (step S104). As shown in FIG. 13E, a protective film 509 is formed so as to cover surfaces of the substrate 501, the partition wall 507b, and the three coloring layers 508R, 508G, and 508B.

That is, after liquid used for the protective film is ejected onto the entire surface of the substrate 501 on which the coloring layers 508R, 508G, and 508B are formed and the drying process is performed, the protective film 509 is formed.

In the manufacturing method of the color filter 500, after the protective film 509 is formed, a coating step is performed in which ITO (Indium Tin Oxide) serving as a transparent electrode in the subsequent step is coated.

Figure 14:
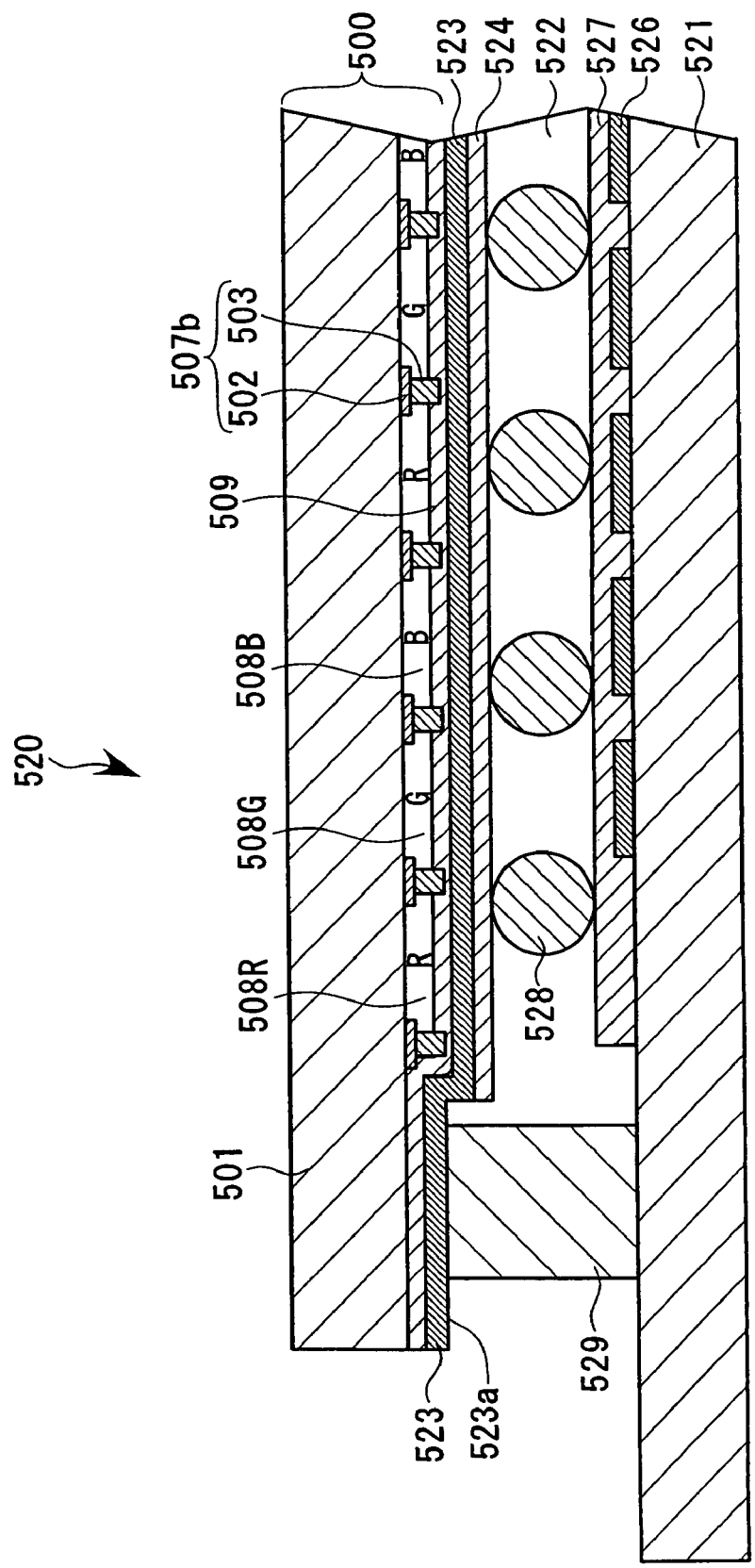
FIG. 14 is a sectional view schematically illustrating an essential part of a first liquid crystal display apparatus employing the color filter according to an embodiment of the invention.

FIG. 14 is a sectional view of an essential part of a passive matrix liquid crystal display apparatus (liquid crystal display apparatus 520) and schematically illustrates a configuration thereof as an example of a liquid crystal display apparatus employing the color filter 500. A transmissive liquid crystal display apparatus as a final product can be obtained by disposing a liquid crystal driving IC (integrated circuit), a backlight, and additional components such as supporting members on the display apparatus 520. Note that the color filter 500 is the same as that shown in FIG. 13, and therefore, reference numerals the same as those used in FIG. 13 are used in FIG. 14 to denote the same components, and descriptions thereof are omitted.

The display apparatus 520 includes the color filter 500, a counter substrate 521 such as a glass substrate, and a liquid crystal layer 522 formed of STN (super twisted nematic) liquid crystal compositions sandwiched therebetween. The color filter 500 is disposed on the upper side of FIG. 14 (on an observer side).

Although not shown, polarizing plates are disposed so as to face an outer surface of the counter substrate 521 and an outer surface of the color filter 500 (surfaces which are remote from the liquid crystal layer 522). A backlight is disposed so as to face an outer surface of the polarizing plate disposed near the counter substrate 521.

A plurality of rectangular first electrodes 523 extending in a horizontal direction are formed with predetermined intervals therebetween on a surface of the protective film 509 (near the liquid crystal layer 522) of the color filter 500. A first alignment layer 524 is arranged so as to cover surfaces of the first electrodes 523 which are surfaces remote from the color filter 500.

On the other hand, a plurality of rectangular second electrodes 526 extending in a direction perpendicular to the first electrodes 523 disposed on the color filter 500 are formed with predetermined intervals therebetween on a surface of the counter substrate 521 which faces the color filter 500. A second alignment layer 527 is arranged so as to cover surfaces of the second electrodes 526 near the liquid crystal layer 522. The first electrodes 523 and the second electrodes 526 are formed of a transparent conductive material such as an ITO.

A plurality of spacers 528 disposed in the liquid crystal layer 522 are used to maintain the thickness (cell gap) of the liquid crystal layer 522 constant. A seal member 529 is used to prevent the liquid crystal compositions in the liquid crystal layer 522 from leaking to the outside. Note that an end of each of the first electrodes 523 extends beyond the seal member 529 and serves as wiring 523a.

Pixels are arranged at intersections of the first electrodes 523 and the second electrodes 526. The coloring layers 508R, 508G, and 508B are arranged on the color filter 500 so as to correspond to the pixels.

In normal manufacturing processing, the first electrodes 523 are patterned and the first alignment layer 524 is applied on the color filter 500 whereby a first half portion of the display apparatus 520 on the color filter 500 side is manufactured. Similarly, the second electrodes 526 are patterned and the second alignment layer 527 is applied on the counter substrate 521 whereby a second half portion of the display apparatus 520 on the counter substrate 521 side is manufactured. Thereafter, the spacers 528 and the seal member 529 are formed on the second half portion, and the first half portion is attached to the second half portion. Then, liquid crystal to be included in the liquid crystal layer 522 is injected from an inlet of the seal member 529, and the inlet is sealed. Finally, the polarizing plates and the backlight are disposed.

The liquid droplet ejection apparatus 1 of this embodiment may apply a spacer material (functional liquid) constituting the cell gap, for example, and uniformly apply liquid crystal (functional liquid) to an area sealed by the seal member 529 before the first half portion is attached to the second half portion. Furthermore, the seal member 529 may be printed using the functional liquid droplet ejection heads 17. Moreover, the first alignment layer 524 and the second alignment layer 527 may be applied using the functional liquid droplet ejection heads 17.

Figure 15:
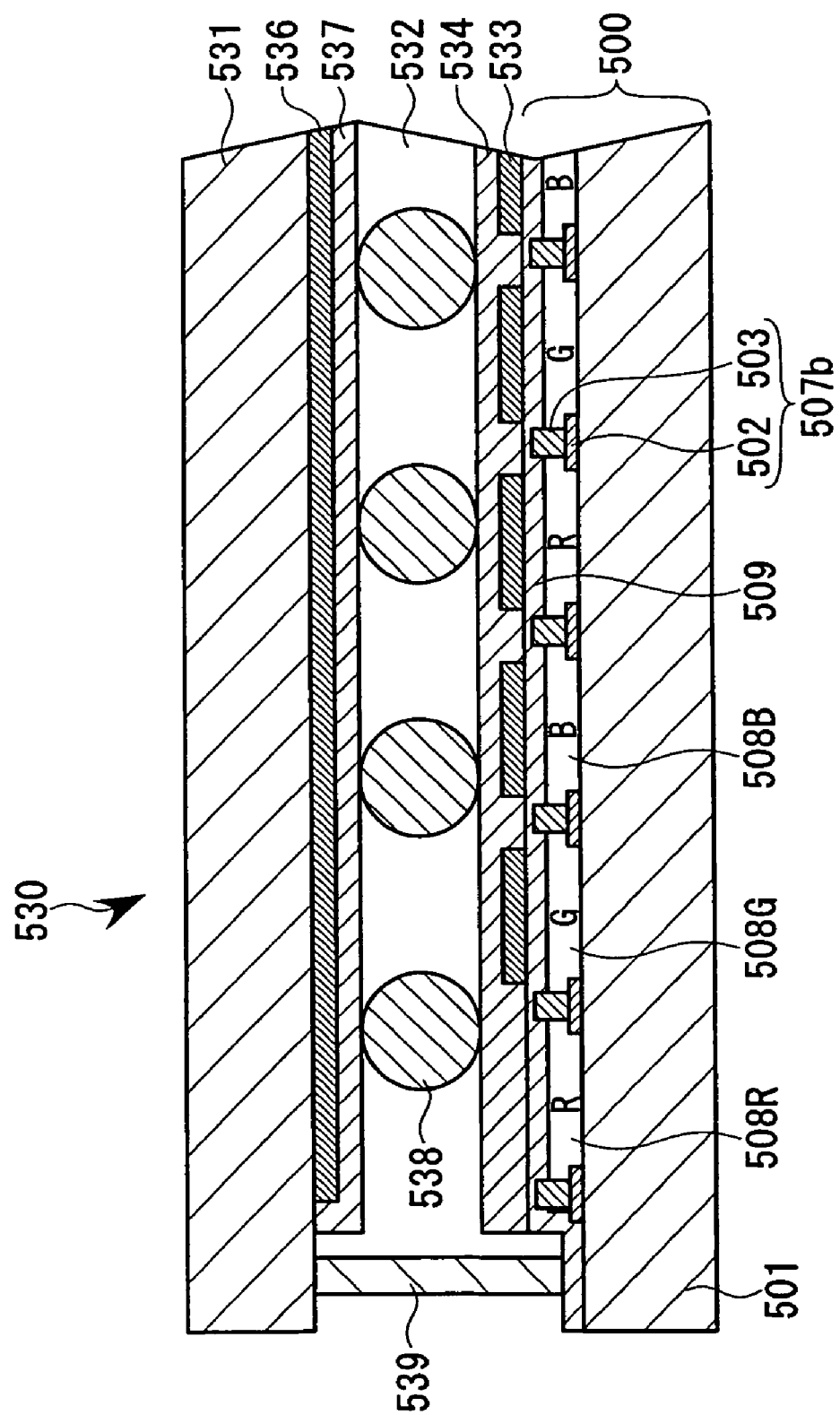
FIG. 15 is a sectional view schematically illustrating an essential part of a second liquid crystal display apparatus employing the color filter according to an embodiment of the invention.

FIG. 15 is a sectional view of an essential part of a display apparatus 530 and schematically illustrates a configuration thereof as a second example of a liquid crystal display apparatus employing the color filter 500 which is manufactured in this embodiment.

The display apparatus 530 is considerably different from the display apparatus 520 in that the color filter 500 is disposed on a lower side in FIG. 15 (remote from the observer).

The display apparatus 530 is substantially configured such that a liquid crystal layer 532 constituted by STN liquid crystal is arranged between the color filter 500 and a counter substrate 531 such as a glass substrate. Although not shown, polarizing plates are disposed so as to face an outer surface of the counter substrate 531 and an outer surface of the color filter 500.

A plurality of rectangular first electrodes 533 extending in a depth direction of FIG. 15 are formed with predetermined intervals therebetween on a surface of the protective film 509 (near the liquid crystal layer 532) of the color filter 500. A first alignment layer 534 is arranged so as to cover surfaces of the first electrodes 533 which are surfaces near the liquid crystal layer 532.

On the other hand, a plurality of rectangular second electrodes 536 extending in a direction perpendicular to the first electrodes 533 disposed on the color filter 500 are formed with predetermined intervals therebetween on a surface of the counter substrate 531 which faces the color filter 500. A second alignment layer 537 is arranged so as to cover surfaces of the second electrodes 536 near the liquid crystal layer 532.

A plurality of spacers 538 disposed in the liquid crystal layer 532 are used to maintain the thickness (cell gap) of the liquid crystal layer 532 constant. A seal member 539 is used to prevent the liquid crystal compositions in the liquid crystal layer 532 from leaking to the outside.

As with the display apparatus 520, pixels are arranged at intersections of the first electrodes 533 and the second electrodes 536. The coloring layers 508R, 508G, and 508B are arranged on the color filter 500 so as to correspond to the pixels.

Figure 16:
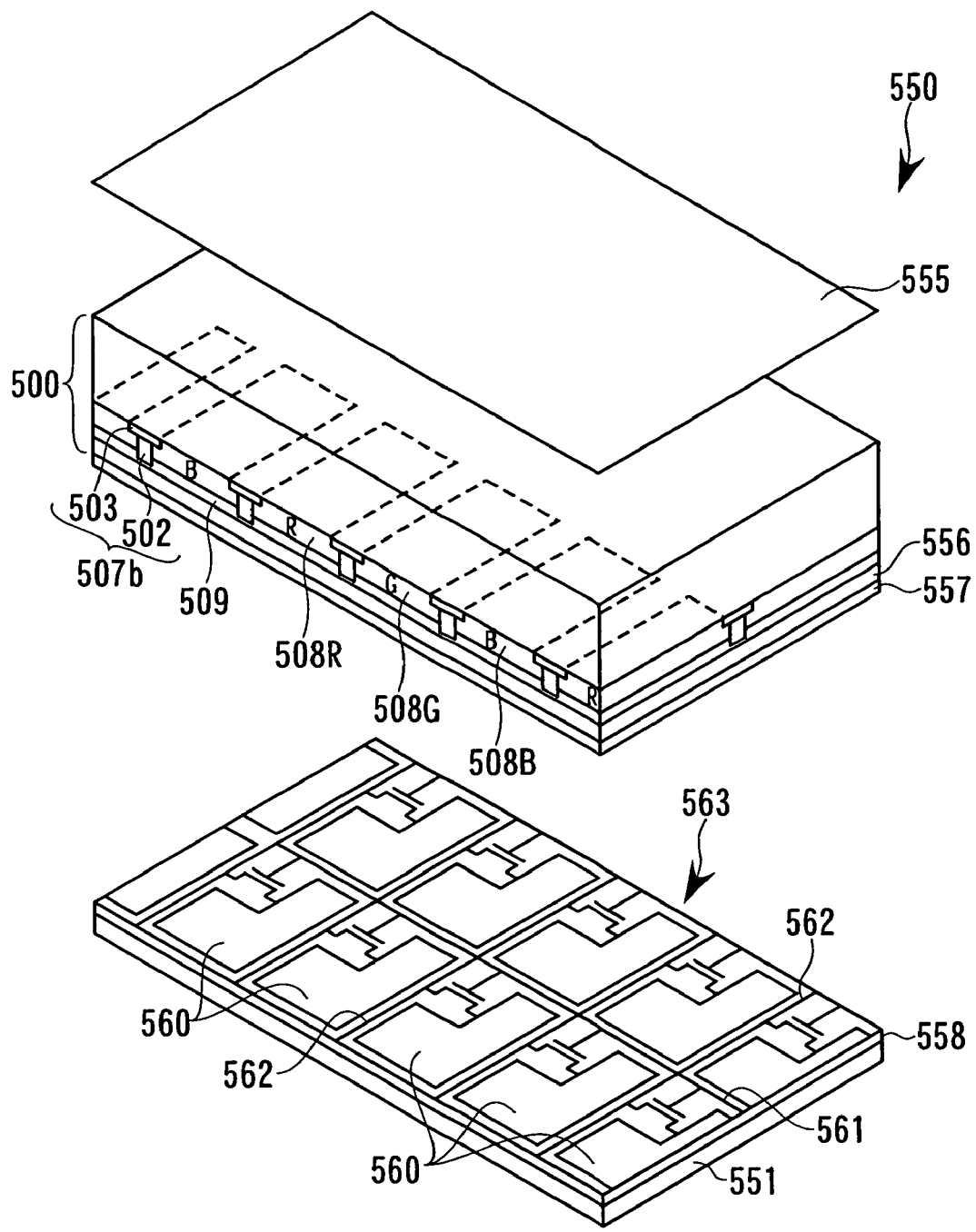
FIG. 16 is a sectional view schematically illustrating an essential part of a third liquid crystal display apparatus employing the color filter according to an embodiment of the invention.

FIG. 16 is an exploded perspective view of a transmissive TFT (thin film transistor) liquid crystal display device and schematically illustrates a configuration thereof as a third example of a liquid crystal display apparatus employing the color filter 500 to which the present invention is applied.

A liquid crystal display apparatus 550 has the color filter 500 disposed on the upper side of FIG. 16 (on the observer side).

The liquid crystal display apparatus 550 includes the color filter 500, a counter substrate 551 disposed so as to face the color filter 500, a liquid crystal layer (not shown) interposed therebetween, a polarizing plate 555 disposed so as to face an upper surface of the color filter 500 (on the observer side), and a polarizing plate (not shown) disposed so as to face a lower surface of the counter substrate 551.

An electrode 556 used for driving the liquid crystal is formed on a surface of the protective film 509 (a surface near the counter substrate 551) of the color filter 500. The electrode 556 is formed of a transparent conductive material such as an ITO and entirely covers an area in which pixel electrodes 560 are to be formed which will be described later. An alignment layer 557 is arranged so as to cover a surface of the electrode 556 remote from the pixel electrode 560.

An insulating film 558 is formed on a surface of the counter substrate 551 which faces the color filter 500. On the insulating film 558, scanning lines 561 and signal lines 562 are arranged so as to intersect with each other. Pixel electrodes 560 are formed in areas surrounded by the scanning lines 561 and the signal lines 562. Note that an alignment layer (not shown) is arranged on the pixel electrodes 560 in an actual liquid crystal display apparatus.

Thin-film transistors 563 each of which includes a source electrode, a drain electrode, a semiconductor layer, and a gate electrode are incorporated in areas surrounded by notch portions of the pixel electrodes 560, the scanning lines 561, and the signal lines 562. When signals are supplied to the scanning lines 561 and the signal lines 562, the thin-film transistors 563 are turned on or off so that power supply to the pixel electrodes 560 is controlled.

Note that although each of the display apparatuses 520, 530, and 550 is configured as a transmissive liquid crystal display apparatus, each of the display apparatuses 520, 530, and 550 may be configured as a reflective liquid crystal display apparatus having a reflective layer or a semi-transmissive liquid crystal display apparatus having a semi-transmissive reflective layer.

Figure 17:
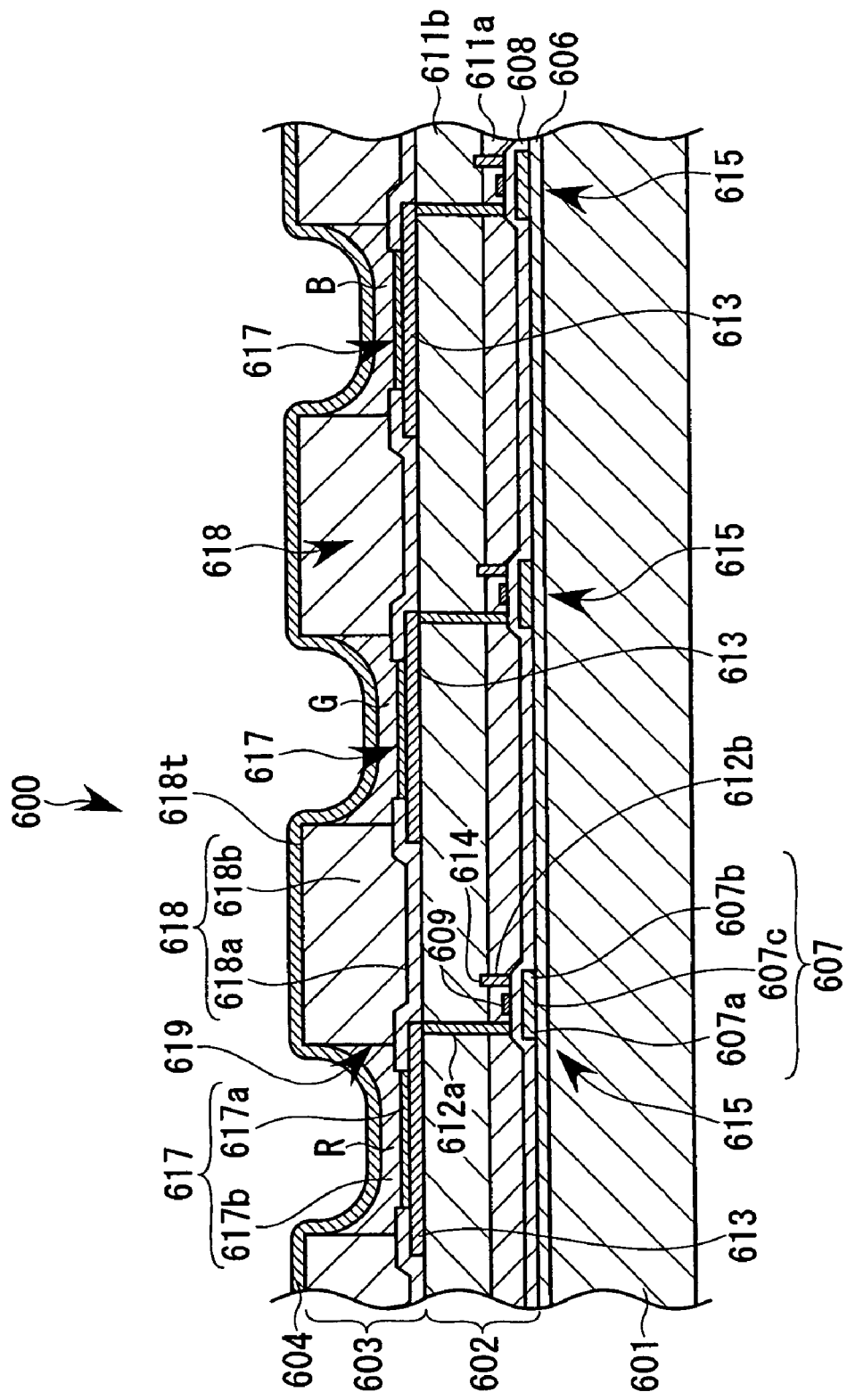
FIG. 17 is a sectional view illustrating an essential part of an organic EL display apparatus.

FIG. 17 is a sectional view illustrating an essential part of a display area of an organic EL apparatus (hereinafter simply referred to as a display apparatus 600).

In this display apparatus 600, a circuit element portion 602, a light-emitting element portion 603, and a cathode 604 are laminated on a substrate (W) 601.

In this display apparatus 600, light is emitted from the light-emitting element portion 603 through the circuit element portion 602 toward the substrate 601 and eventually is emitted to an observer side. In addition, light emitted from the light-emitting element portion 603 toward an opposite side of the substrate 601 is reflected by the cathode 604, and thereafter passes through the circuit element portion 602 and the substrate 601 to be emitted to the observer side.

An underlayer protective film 606 formed of a silicon oxide film is arranged between the circuit element portion 602 and the substrate 601. Semiconductor films 607 formed of polysilicon oxide films are formed on the underlayer protective film 606 (near the light-emitting element portion 603) in an isolated manner. In each of the semiconductor films 607, a source region 607a and a drain region 607b are formed on the left and right sides thereof, respectively, by high-concentration positive-ion implantation. The center portion of each of the semiconductor films 607 which is not subjected to high-concentration positive-ion implantation serves as a channel region 607c.

In the circuit element portion 602, the underlayer protective film 606 and a transparent gate insulating film 608 covering the semiconductor films 607 are formed. Gate electrodes 609 formed of, for example, Al, Mo, Ta, Ti, or W are disposed on the gate insulating film 608 so as to correspond to the channel regions 607c of the semiconductor films 607. A first transparent interlayer insulating film 611a and a second transparent interlayer insulating film 611b are formed on the gate electrodes 609 and the gate insulating film 608. Contact holes 612a and 612b are formed so as to penetrate the first interlayer insulating film 611a and the second interlayer insulating film 611b and to be connected to the source region 607a and the drain region 607b of the semiconductor films 607.

Pixel electrodes 613 which are formed of ITOs, for example, and which are patterned to have a predetermined shape are formed on the second interlayer insulating film 611b. The pixel electrode 613 is connected to the source region 607a through the contact holes 612a.

Power source lines 614 are arranged on the first interlayer insulating film 611a. The power source lines 614 are connected through the contact holes 612b to the drain region 607b.

As shown in FIG. 17, the circuit element portion 602 includes thin-film transistors 615 connected to drive the respective pixel electrodes 613.

The light-emitting element portion 603 includes a functional layers 617 each formed on a corresponding one of pixel electrodes 613, and bank portions 618 which are formed between the pixel electrodes 613 and the functional layers 617 and which are used to partition the functional layers 617 from one another.

The pixel electrodes 613, the functional layers 617, and the cathode 604 formed on the functional layers 617 constitute the light-emitting element. Note that the pixel electrodes 613 are formed into a substantially rectangular shape in plan view by patterning, and the bank portions 618 are formed so that each two of the pixel electrodes 613 sandwich a corresponding one of the bank portions 618.

Each of the bank portions 618 includes an inorganic bank layer 618a (first bank layer) formed of an inorganic material such as SiO, $SiO_2$, or $TiO_2$, and an organic bank layer 618b (second bank layer) which is formed on the inorganic bank layer 618a and has a trapezoidal shape in a sectional view. The organic bank layer 618b is formed of a resist, such as an acrylic resin or a polyimide resin, which has an excellent heat resistance and an excellent lyophobic characteristic. A part of each of the bank portions 618 overlaps peripheries of corresponding two of the pixel electrodes 613 which sandwich each of the bank portions 618.

Openings 619 are formed between the bank portions 618 so as to gradually increase in size upwardly.

Each of the functional layers 617 includes a positive-hole injection/transport layer 617a formed so as to be laminated on the pixel electrodes 613 and a light-emitting layer 617b formed on the positive-hole injection/transport layer 617a. Note that another functional layer having another function may be arranged so as to be arranged adjacent to the light-emitting layer 617b. For example, an electronic transport layer may be formed.

The positive-hole injection/transport layer 617a transports positive holes from a corresponding one of the pixel electrodes 613 and injects the transported positive holes to the light-emitting layer 617b. The positive-hole injection/transport layer 617a is formed by ejection of a first composition (functional liquid) including a positive-hole injection/transport layer forming material. The positive-hole injection/transport layer forming material may be a known material.

The light-emitting layer 617b is used for emission of light having colors red (R), green (G), or blue (B), and is formed by ejection of a second composition (functional liquid) including a material for forming the light-emitting layer 617b (light-emitting material). As a solvent of the second composition (nonpolar solvent), a known material which is insoluble to the positive-hole injection/transport layer 617a is preferably used. Since such a nonpolar solvent is used as the second composition of the light-emitting layer 617b, the light-emitting layer 617b can be formed without dissolving the positive-hole injection/transport layer 617a again.

The light-emitting layer 617b is configured such that the positive holes injected from the positive-hole injection/transport layer 617a and electrons injected from the cathode 604 are recombined in the light-emitting layer 617b so as to emit light.

The cathode 604 is formed so as to cover an entire surface of the light-emitting element portion 603, and in combination with the pixel electrodes 613, supplies current to the functional layers 617. Note that a sealing member (not shown) is arranged on the cathode 604.

Steps of manufacturing the display apparatus 600 will now be described with reference to FIGS. 18 to 26.

Figure 18:
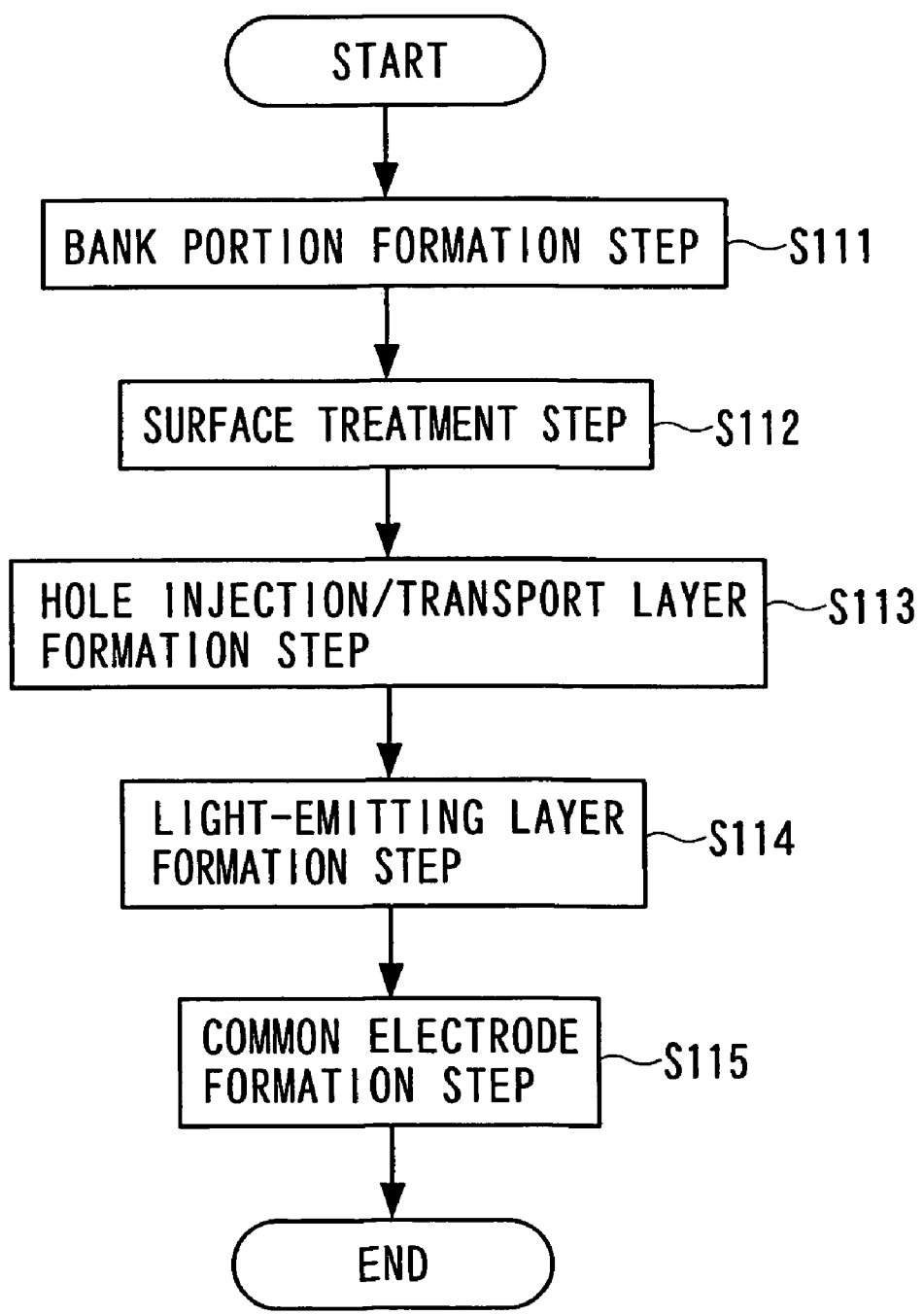
FIG. 18 is a flowchart illustrating manufacturing steps of the organic EL display apparatus.

As shown in FIG. 18, the display apparatus 600 is manufactured through a bank portion forming step (S111), a surface processing step (S112), a positive-hole injection/transport layer forming step (S113), a light-emitting layer forming step (S114), and a counter electrode forming step (S115). Note that the manufacturing steps are not limited to these examples shown in FIG. 18, and one of these steps may be eliminated or another step may be added according to need.

Figure 19:
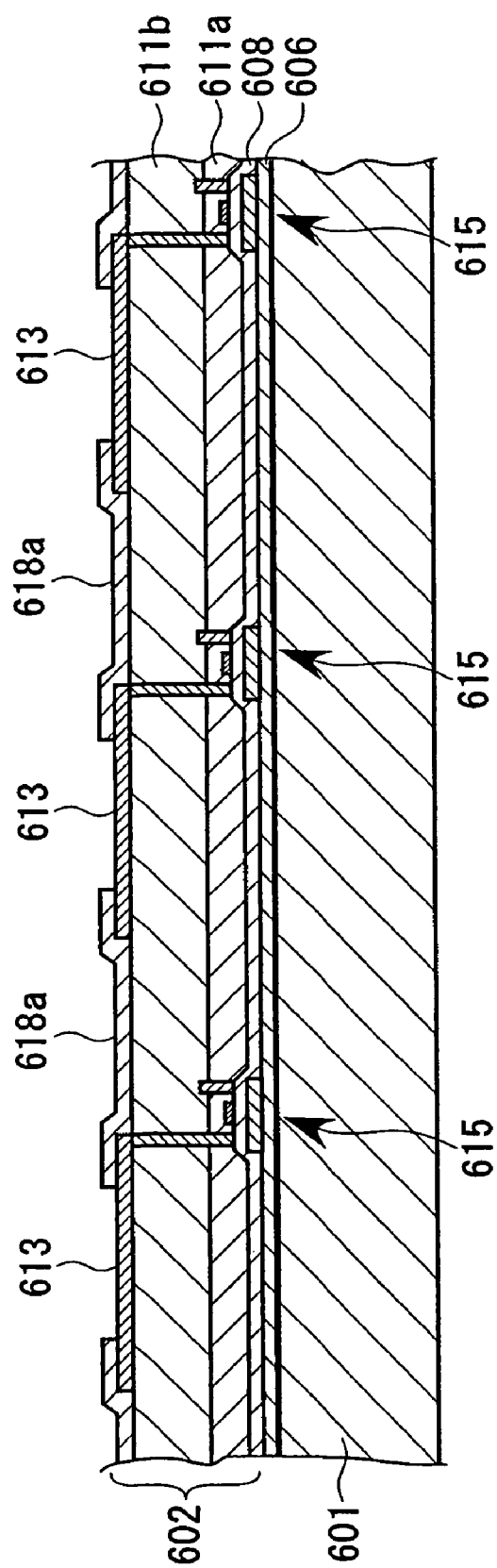
FIG. 19 is a process chart illustrating formation of an inorganic bank layer.

In the bank portion forming step (S111), as shown in FIG. 19, the inorganic bank layers 618a are formed on the second interlayer insulating film 611b. The inorganic bank layers 618a are formed by forming an inorganic film at a desired position and by patterning the inorganic film by the photolithography technique. At this time, a part of each of the inorganic bank layers 618a overlaps peripheries of corresponding two of the pixel electrodes 613 which sandwich each of the inorganic bank layers 618a.

Figure 20:
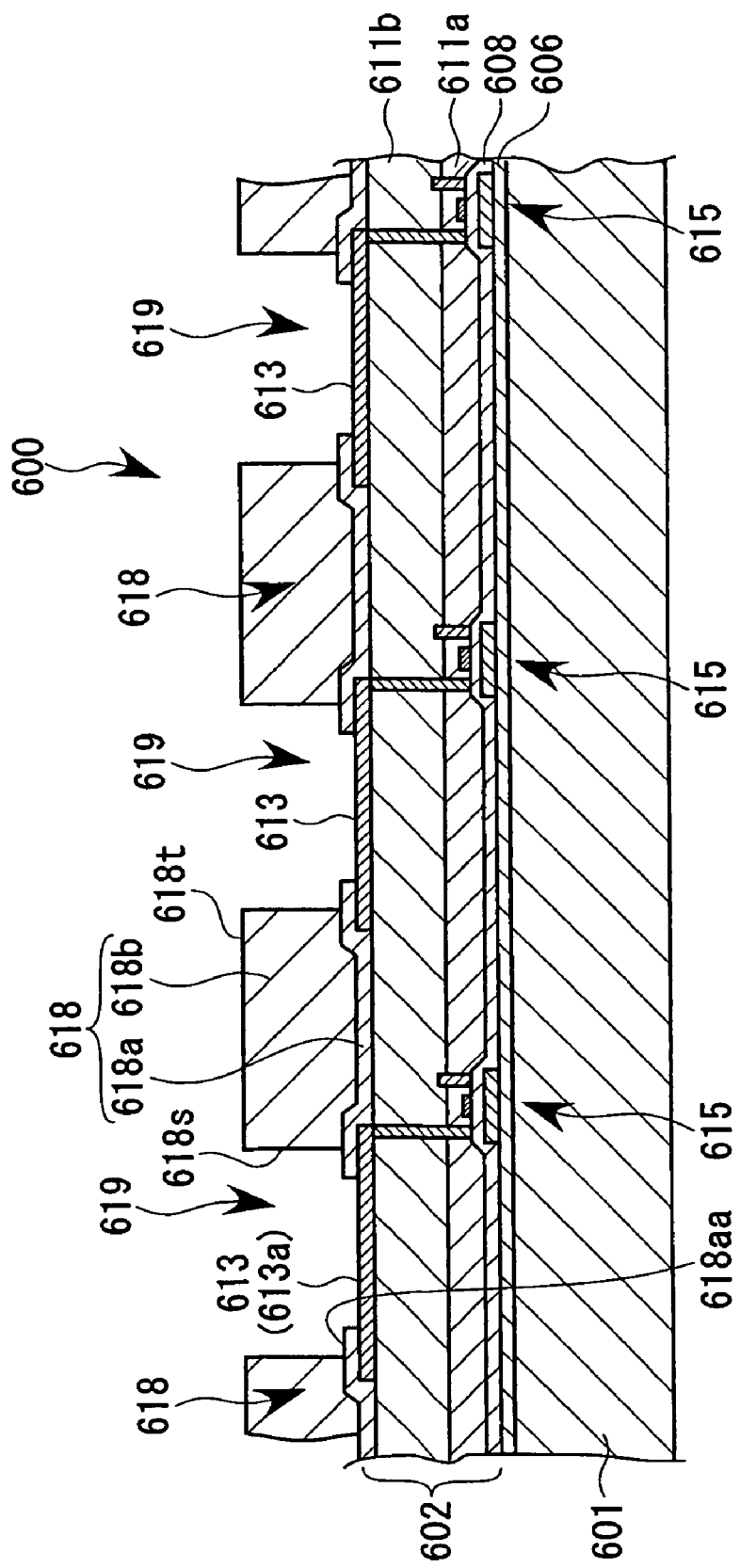
FIG. 20 is a process chart illustrating formation of an organic bank layer.

After the inorganic bank layers 618a are formed, as shown in FIG. 20, the organic bank layers 618b are formed on the inorganic bank layers 618a. As with the inorganic bank layers 618a, the organic bank layers 618b are formed by patterning a formed organic film by the photolithography technique.

The bank portions 618 are thus formed. When the bank portions 618 are formed, the openings 619 opening upward relative to the pixel electrodes 613 are formed between the bank portions 618. The openings 619 define pixel areas.

In the surface processing step (S112), a hydrophilic treatment and a repellency treatment are performed. The hydrophilic treatment is performed on first lamination areas 618aa of the inorganic bank layers 618a and electrode surfaces 613a of the pixel electrodes 613. The hydrophilic treatment is performed, for example, by plasma processing using oxide as a processing gas on surfaces of the first lamination areas 618aa and the electrode surfaces 613a to have hydrophilic properties. By performing the plasma processing, the ITO forming the pixel electrodes 613 is cleaned.

The repellency treatment is performed on walls 618s of the organic bank layers 618b and upper surfaces 618t of the organic bank layers 618b. The repellency treatment is performed as a fluorination treatment, for example, by plasma processing using tetrafluoromethane as a processing gas on the walls 618s and the upper surfaces 618t.

By performing this surface processing step, when the functional layers 617 is formed using the functional liquid droplet ejection heads 17, the functional liquid droplets are ejected onto the pixel areas with high accuracy. Furthermore, the functional liquid droplets attached onto the pixel areas are prevented from flowing out of the openings 619.

A display apparatus body 600A is obtained through these steps. The display apparatus body 600A is mounted on the set table 21 of the liquid droplet ejection apparatus 1 shown in FIG. 1 and the positive-hole injection/transport layer forming step (S113) and the light-emitting layer forming step (S114) are performed thereon.

Figure 21:
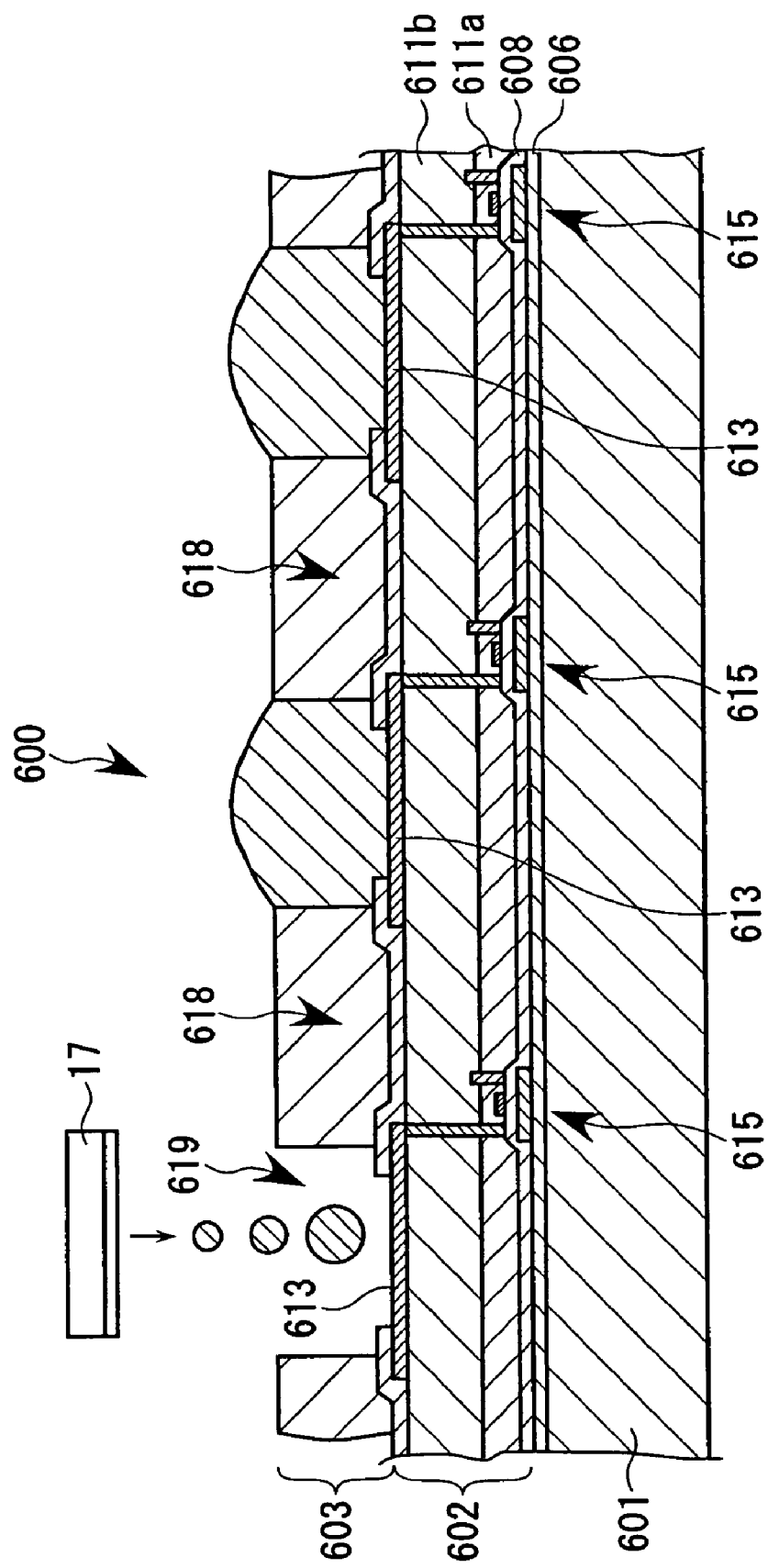
FIG. 21 is a process chart illustrating processes of forming a positive-hole injection/transport layer.
Figure 22:
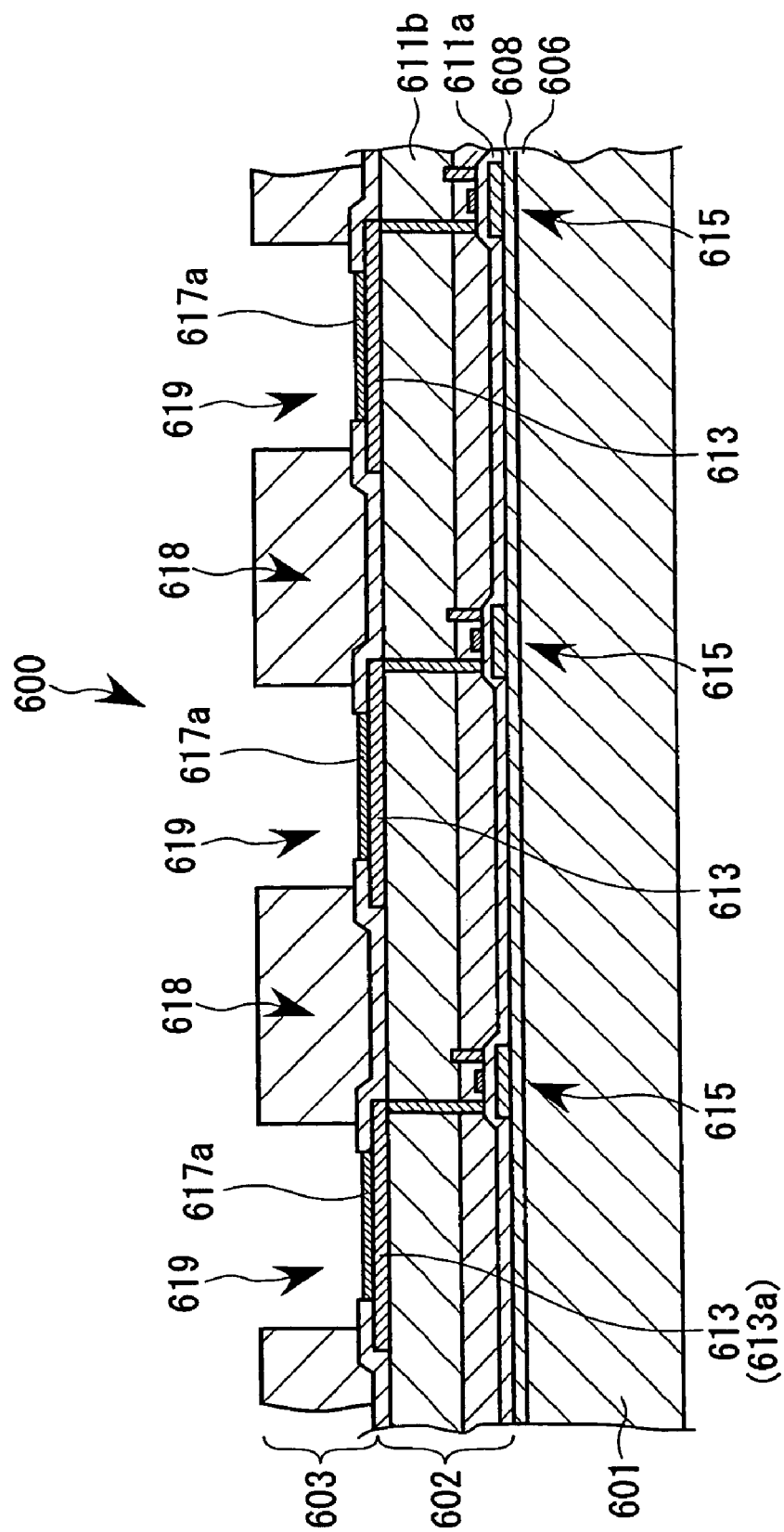
FIG. 22 is a process chart illustrating a state where the positive-hole injection/transport layer has been formed.

As shown in FIG. 21, in the positive-hole injection/transport layer forming step (S113), the first compositions including the material for forming a positive-hole injection/transport layer are ejected from the functional liquid droplet ejection heads 17 into the openings 619 included in the pixel areas. Thereafter, as shown in FIG. 22, drying processing and a thermal treatment are performed to evaporate polar solution included in the first composition whereby the positive-hole injection/transport layers 617a are formed on the pixel electrodes 613 (electrode surface 613a).

The light-emitting layer forming step (S114) will now be described. In the light-emitting layer forming step, as described above, a nonpolar solvent which is insoluble to the positive-hole injection/transport layers 617a is used as the solvent of the second composition used at the time of forming the light-emitting layer in order to prevent the positive-hole injection/transport layers 617a from being dissolved again.

On the other hand, since each of the positive-hole injection/transport layers 617a has low affinity to a nonpolar solvent, even when the second composition including the nonpolar solvent is ejected onto the positive-hole injection/transport layers 617a, the positive-hole injection/transport layers 617a may not be brought into tight contact with the light-emitting layers 617b or the light-emitting layers 617b may not be uniformly applied.

Accordingly, before the light-emitting layers 617b are formed, surface processing (surface improvement processing) is preferably performed so that each of the positive-hole injection/transport layers 617a has high affinity to the nonpolar solvent and to the material for forming the light-emitting layers. The surface processing is performed by applying a solvent the same as or similar to the nonpolar solvent of the second composition used at the time of forming the light-emitting layers on the positive-hole injection/transport layers 617a and by drying the applied solvent.

Employment of this surface processing allows the surface of the positive-hole injection/transport layers 617a to have high affinity to the nonpolar solvent, and therefore, the second composition including the material for forming the light-emitting layers can be uniformly applied to the positive-hole injection/transport layers 617a in the subsequent step.

Figure 23:
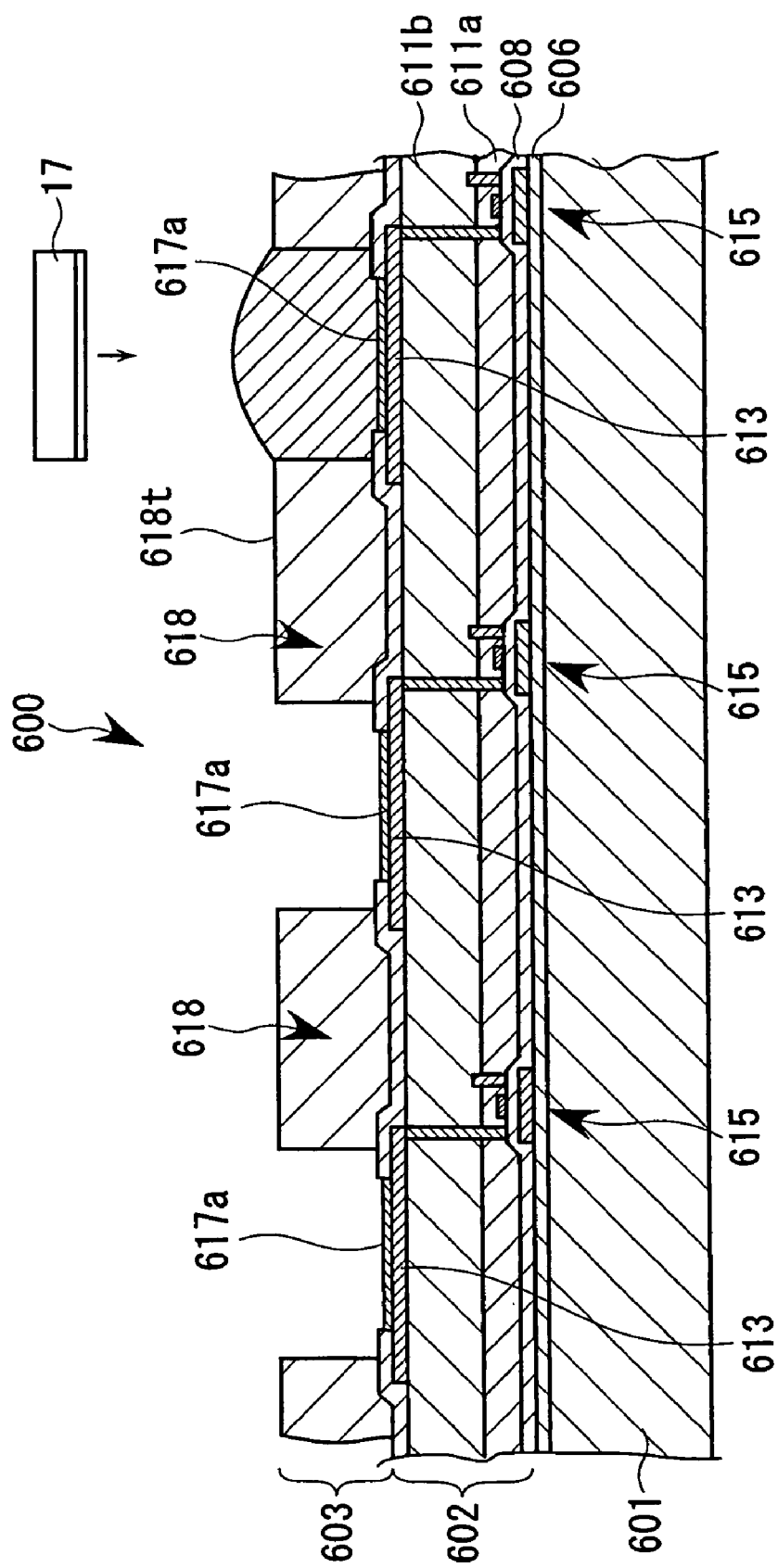
FIG. 23 is a process chart illustrating processes for forming a light-emitting layer having a blue color component.

As shown in FIG. 23, a predetermined amount of second composition including the material for forming the light-emission layers of one of the three colors (blue color (B) in an example of FIG. 23) is ejected into the pixel areas (openings 619) as functional liquid. The second composition ejected into the pixel areas spreads over the positive-hole injection/transport layer 617a and fills the openings 619. Note that, even if the second composition is ejected and attached to the upper surfaces 618t of the bank portions 618 which are outside of the pixel area, since the repellency treatment has been performed on the upper surfaces 618t as described above, the second component easily drops into the openings 619.

Figure 24:
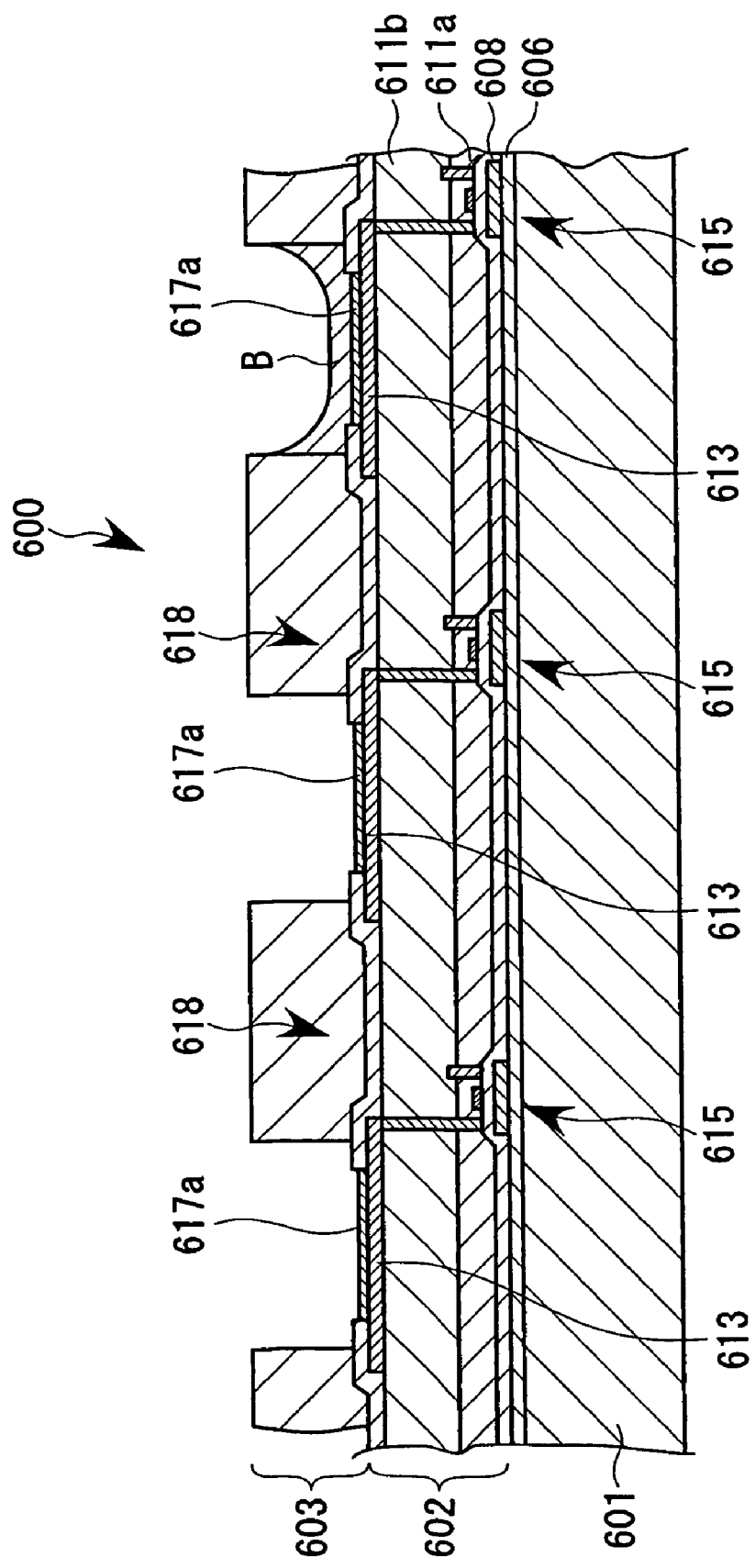
FIG. 24 is a process chart illustrating a state where the light-emitting layer having a blue color component has been formed.

Thereafter, the drying processing is performed so that the ejected second composition is dried and the nonpolar solvent included in the second composition is evaporated whereby the light-emitting layers 617b are formed on the positive-hole injection/transport layers 617a as shown in FIG. 24. In FIG. 24, one of the light-emitting layers 617b corresponding to the blue color (B) is formed.

Figure 25:
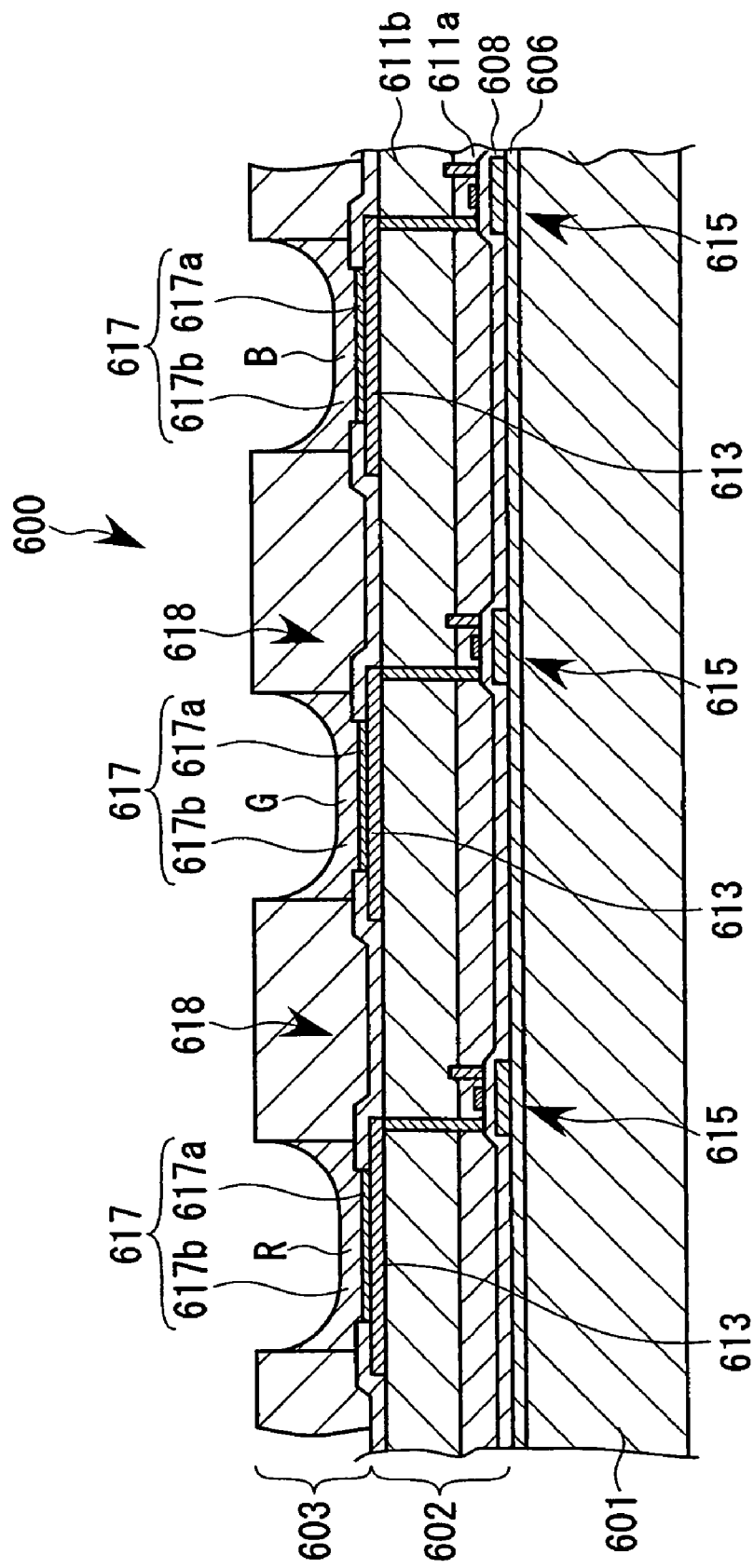
FIG. 25 is a process chart illustrating a state where light-emitting layers having three color components have been formed.

Similarly, as shown in FIG. 25, a step similar to the above-described step of forming the light-emitting layers 617b corresponding to the blue color (B) is repeatedly performed so that the light-emitting layers 617b corresponding to other colors (red (R) and green (G)) are formed. Note that the order of formation of the light-emitting layers 617b is not limited to the order described above as an example, and any other orders may be applicable. For example, an order of forming the light-emitting layers 617b may be determined in accordance with a light-emitting layer forming material. Furthermore, the color scheme pattern of the three colors R, G, and B may be the tripe arrangement, the mosaic arrangement, or the delta arrangement.

As described above, the functional layers 617, that is, the positive-hole injection/transport layers 617a and the light-emitting layers 617b are formed on the pixel electrodes 613. Then, the process proceeds to the counter electrode forming step (S115).

Figure 26:
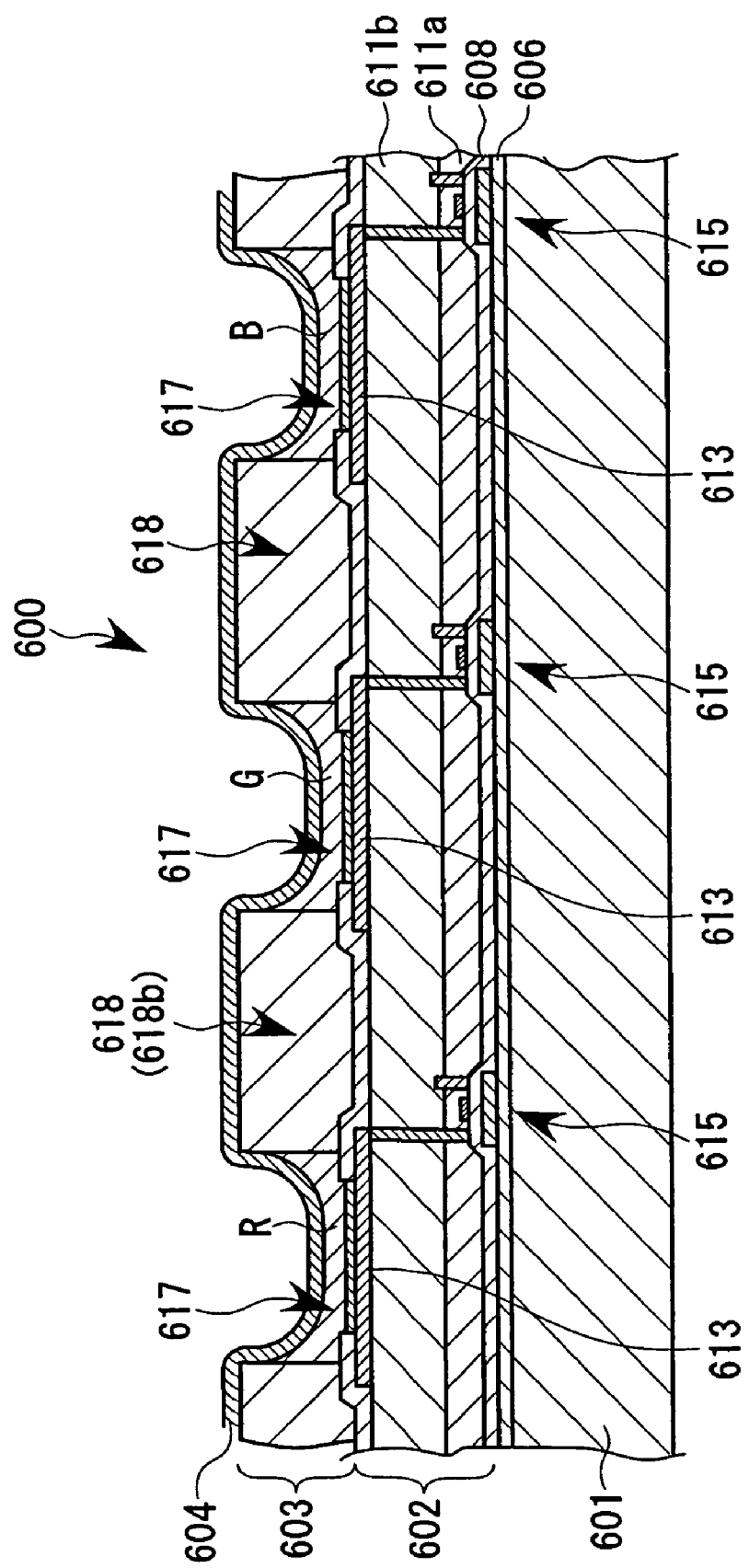
FIG. 26 is a process chart illustrating processes for forming a cathode.

In the counter electrode forming step (S115), as shown in FIG. 26, the cathode (counter electrode) 604 is formed on entire surfaces of the light-emitting layers 617b and the organic bank layers 618b by an evaporation method, sputtering, or a CVD (chemical vapor deposition) method, for example. The cathode 604 is formed by laminating a calcium layer and an aluminum layer, for example, in this embodiment.

An Al film and a Ag film as electrodes and a protective layer formed of $SiO_2$ or SiN for preventing the Al film and the Ag film from being oxidized are formed on the cathode 604.

After the cathode 604 is thus formed, other processes such as sealing processing of sealing a top surface of the cathode 604 with a sealing member and wiring processing are performed whereby the display apparatus 600 is obtained.

Figure 27:
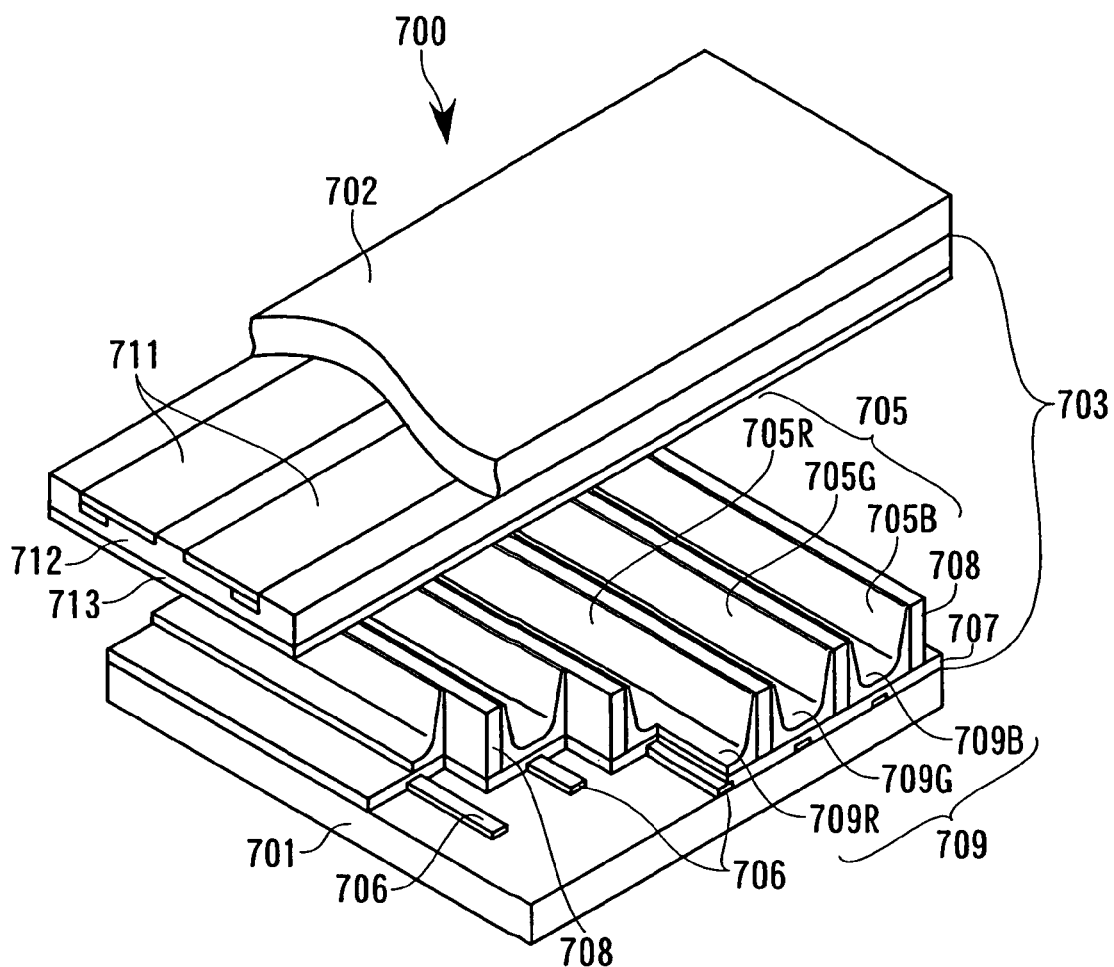
FIG. 27 is a perspective view illustrating an essential part of a plasma display apparatus (PDP apparatus).

FIG. 27 is an exploded perspective view of an essential part of a plasma display apparatus (PDP apparatus: hereinafter simply referred to as a display apparatus 700). Note that, in FIG. 27, the display apparatus 700 is partly cut away.

The display apparatus 700 includes a first substrate 701, a second substrate 702 which faces the first substrate 701, and a discharge display portion 703 interposed therebetween. The discharge display portion 703 includes a plurality of discharge chambers 705. The discharge chambers 705 include red discharge chambers 705R, green discharge chambers 705G, and blue discharge chambers 705B, and are arranged so that one of the red discharge chambers 705R, one of the green discharge chambers 705G, and one of the blue discharge chambers 705B constitute one pixel as a group.

Address electrodes 706 are arranged on the first substrate 701 with predetermined intervals therebetween in a stripe pattern, and a dielectric layer 707 is formed so as to cover top surfaces of the address electrodes 706 and the first substrate 701. Partition walls 708 are arranged on the dielectric layer 707 so as to be arranged along with the address electrodes 706 in a standing manner between the adjacent address electrodes 706. Some of the partition walls 708 extend in a width direction of the address electrodes 706 as shown in FIG. 27, and the others (not shown) extend perpendicular to the address electrodes 706.

Regions partitioned by the partition walls 708 serve as the discharge chambers 705.

The discharge chambers 705 include respective fluorescent substances 709. Each of the fluorescent substances 709 emits light having one of the colors of red (R), green (G) and blue (B). The red discharge chamber 705R has a red fluorescent substance 709R on its bottom surface, the green discharge chamber 705G has a green fluorescent substance 709G on its bottom surface, and the blue discharge chamber 705B has a blue fluorescent substance 709B on its bottom surface.

A plurality of display electrodes 711 are formed with predetermined intervals therebetween in a stripe manner in a direction perpendicular to the address electrodes 706. A dielectric layer 712 and a protective film 713 formed of MgO, for example, are formed so as to cover the display electrodes 711.

The first substrate 701 and the second substrate 702 are attached so that the address electrodes 706 are arranged perpendicular to the display electrodes 711. Note that the address electrodes 706 and the display electrodes 711 are connected to an alternate power source (not shown).

When the address electrodes 706 and the display electrodes 711 are brought into conduction states, the fluorescent substances 709 are excited and emit light whereby display with colors is achieved.

In this embodiment, the address electrodes 706, the display electrodes 711, and the fluorescent substances 709 may be formed using the liquid droplet ejection apparatus 1 shown in FIG. 1. Steps of forming the address electrodes 706 on the first substrate 701 are described hereinafter.

The steps are performed in a state where the first substrate 701 is mounted on the set table 21 on the liquid droplet ejection apparatus 1.

The functional liquid droplet ejection heads 17 eject a liquid material (functional liquid) including a material for forming a conducting film wiring as functional droplets to be attached onto regions for forming the address electrodes 706. The material for forming a conducting film wiring included in the liquid material is formed by dispersing conductive fine particles such as those of a metal into dispersed media. Examples of the conductive fine particles include a metal fine particle including gold, silver, copper, palladium, or nickel, and a conductive polymer.

When ejection of the liquid material onto all the desired regions for forming the address electrodes 706 is completed, the ejected liquid material is dried, and the disperse media included in the liquid material is evaporated whereby the address electrodes 706 are formed.

Although the steps of forming the address electrodes 706 are described as an example above, the display electrodes 711 and the fluorescent substances 709 may be formed by the steps described above.

In a case where the display electrodes 711 are formed, as with the address electrodes 706, a liquid material (functional liquid) including a material for forming a conducting film wiring is ejected from the functional liquid droplet ejection heads 17 as liquid droplets to be attached to the areas for forming the display electrodes.

In a case where the fluorescent substances 709 are formed, a liquid material including fluorescent materials corresponding to three colors (R, G, and B) is ejected as liquid droplets from the functional liquid droplet ejection heads 17 so that liquid droplets having the three colors (R, G, and B) are attached within the discharge chambers 705.

Figure 28:
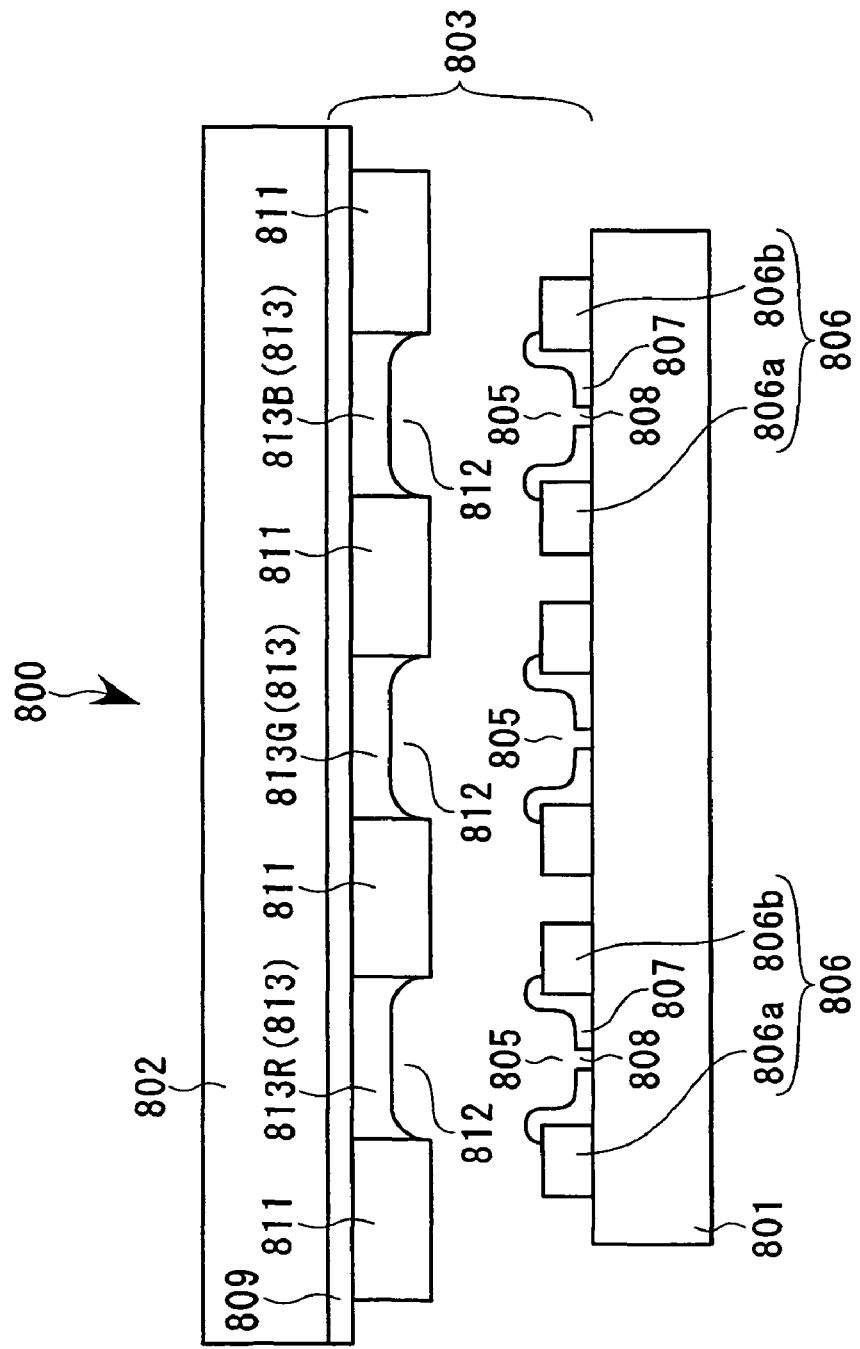
FIG. 28 is a sectional view illustrating an essential part of an electron emission display apparatus (FED apparatus).

FIG. 28 shows a sectional view of an essential part of an electron emission apparatus (also referred to as a FED apparatus or a SED apparatus: hereinafter simply referred to as a display apparatus 800). In FIG. 28, a part of the display apparatus 800 is shown in the sectional view.

The display apparatus 800 includes a first substrate 801, a second substrate 802 which faces the first substrate 801, and a field-emission display portion 803 interposed therebetween. The field-emission display portion 803 includes a plurality of electron emission portions 805 arranged in a matrix.

First element electrodes 806a and second element electrodes 806b, and conductive films 807 are arranged on the first substrate 801. The first element electrodes 806a and the second element electrodes 806b intersect with each other. Cathode electrodes 806 are formed on the first substrate 801, and each of the cathode electrodes 806 is constituted by one of the first element electrodes 806a and one of the second element electrodes 806b. In each of the cathode electrodes 806, one of the conductive films 807 having a gap 808 is formed in a portion formed by the first element electrode 806a and the second element electrode 806b. That is, the first element electrodes 806a, the second element electrodes 806b, and the conductive films 807 constitute the plurality of electron emission portions 805. Each of the conductive films 807 is constituted by palladium oxide (PdO). In each of the cathode electrodes 806, the gap 808 is formed by forming processing after the corresponding one of the conductive films 807 is formed.

An anode electrode 809 is formed on a lower surface of the second substrate 802 so as to face the cathode electrodes 806. A bank portion 811 is formed on a lower surface of the anode electrode 809 in a lattice. Fluorescent materials 813 are arranged in opening portions 812 which opens downward and which are surrounded by the bank portion 811. The fluorescent materials 813 correspond to the electron emission portions 805. Each of the fluorescent materials 813 emits fluorescent light having one of the three colors, red (R), green (G), and blue (B). Red fluorescent materials 813R, green fluorescent materials 813G, and blue fluorescent materials 813B are arranged in the opening portions 812 in a predetermined arrangement pattern described above.

The first substrate 801 and the second substrate 802 thus configured are attached with each other with a small gap therebetween. In this display apparatus 800, electrons emitted from the first element electrodes 806a or the second element electrodes 806b included in the cathode electrodes 806 hit the fluorescent materials 813 formed on the anode electrode 809 so that the fluorescent materials 813 are excited and emit light whereby display with colors is achieved.

As with the other embodiments, in this case also, the first element electrodes 806a, the second element electrodes 806b, the conductive films 807, and the anode electrode 809 may be formed using the liquid droplet ejection apparatus 1. In addition, the red fluorescent materials 813R, the green fluorescent materials 813G, and the blue fluorescent materials 813B may be formed using the liquid droplet ejection apparatus 1.

Figure 29A:
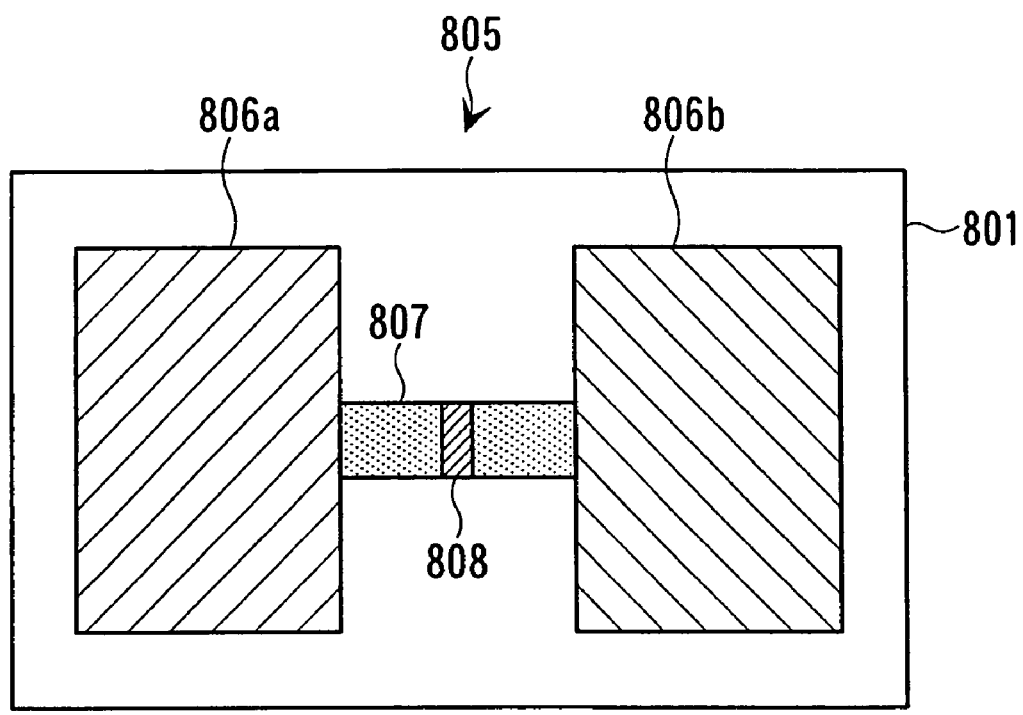
FIG. 29A is a plan view illustrating an electron emission portion and the vicinity thereof of a display apparatus.
Figure 29B:
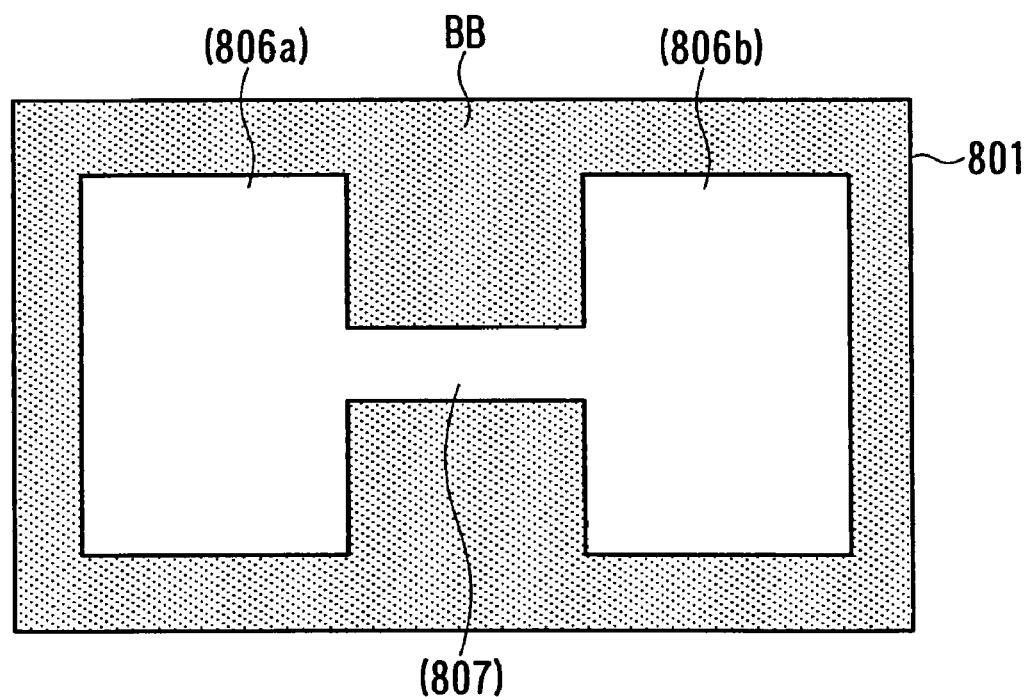
FIG. 29B is a plan view illustrating a method of forming the electron emission portion and the vicinity thereof.

Each of the first element electrodes 806a, each of the second element electrodes 806b, and each of the conductive films 807 have shapes as shown in FIG. 29A. When the first element electrodes 806a, the second element electrodes 806b, and the conductive films 807 are formed, portions for forming the first element electrodes 806a, the second element electrodes 806b, and the conductive films 807 are left as they are on the first substrate 801 and only bank portions BB are formed (by a photolithography method) as shown in FIG. 29B. Then, the first element electrodes 806a and the second element electrodes 806b are formed by an inkjet method using a solvent ejected from the liquid droplet ejection apparatus 1 in grooves defined by the bank portions BB and are formed by drying the solvent. Thereafter, the conductive films 807 are formed by the inkjet method using the liquid droplet ejection apparatus 1. After forming the conductive films 807, the bank portions BB are removed by ashing processing and the forming processing is performed. Note that, as with the case of the organic EL device, the hydrophilic treatment is preferably performed on the first substrate 801 and the second substrate 802 and the repellency treatment is preferably performed on the bank portion 811 and the bank portions BB.

Examples of other electro-optical apparatuses include an apparatus for forming metal wiring, an apparatus for forming a lens, an apparatus for forming a resist, and an apparatus for forming an optical diffusion body. Use of the liquid droplet ejection apparatus 1 makes it possible to efficiently manufacture various electro-optical apparatuses.

What is claimed is:

1. A liquid droplet ejection apparatus that performs printing processing by ejecting functional liquid from functional liquid droplet ejection heads onto a workpiece while a set table on which the workpiece is mounted and which faces a printing area moves in a scanning direction relative to the functional liquid droplet ejection heads, the liquid droplet ejection apparatus comprising:

an ejection inspecting section configured to have a printing unit which is arranged on a movement locus of the set table and to which an inspection pattern is printed by inspection ejection using the functional liquid droplet ejection heads, configured to recognize the inspection pattern printed on the printing unit as an image, and configured to inspect ejection performance of the functional liquid droplet ejection heads;

a workpiece alignment section configured to align the workpiece relative to the set table;

a table moving section configured to move the set table in the scanning direction in the printing area and configured to move the set table in the scanning direction between the printing area and an alignment position located in a first side relative to the printing area;

a unit moving section configured to move the printing unit independently of the set table, in the scanning direction between a retracted position located in a second side relative to the printing area and an inspection position located beneath the functional liquid droplet ejection heads;

a controller configured to control the functional liquid droplet ejection heads, the ejection inspecting section, the table moving section, the unit moving section, and the workpiece alignment section; wherein the table moving section includes a first slider used to support the set table and a common supporting base used to support the first slider to slide in the scanning direction, and the unit moving section includes a second slider used to support the printing unit and the common supporting base used to support the second slider to slide in the scanning direction; and a periodic flushing box which is disposed on the second slider and which is used to receive functional liquid forcibly ejected from the functional liquid droplet ejection heads, wherein the controller allows alignment processing of moving the set table to the alignment position and aligning the workpiece and inspection processing of moving the printing unit to the inspection position and performing the inspection ejection and inspection of the ejection performance to be performed simultaneously.

2. The liquid droplet ejection apparatus according to claim 1, further comprising:

a workpiece replacement section configured to perform replacement processing of dismounting a workpiece which has been printed from the set table and mounting a workpiece which has yet to be processed on the set table, wherein the controller further controls the workpiece replacement section to perform the replacement processing after the set table moves to the alignment position and before the workpiece is aligned, and the replacement processing and the inspection processing are simultaneously performed.

3. The liquid droplet ejection apparatus according to claim 1, wherein the printing unit includes a printing sheet on which the inspection pattern is printed, an inspection stage on which the printing sheet is mounted, and a sheet feeding section configured to feed a portion of the printing sheet which has been inspected out of the inspection stage and to feed a portion of the printing sheet which has yet to be inspected into the inspection stage, and the controller allows the workpiece to be printed and allows the printing sheet to be fed simultaneously while the printing unit is located in the retracted position.

4. The liquid droplet ejection apparatus according to claim 3,
wherein the printing unit further includes a defect detection sensor configured to detect improper setting of the printing sheet fed to the inspection stage, and
the controller allows the workpiece to be printed and allows the defect detection sensor to detect the improper setting of the printing sheet simultaneously while the printing unit is located in the retracted position.

5. A method of manufacturing an electro-optical apparatus, wherein film portions are formed by ejecting functional liquid onto the workpiece using the liquid droplet ejection apparatus set forth in claim 1.

6. An electro-optical apparatus, wherein film portions are formed by ejecting functional liquid onto the workpiece using the liquid droplet ejection apparatus set forth in claim 1.

7. An electronic apparatus that employs an electro-optical apparatus manufactured by the method of manufacturing an electro-optical apparatus set forth in claim 5.

* * * * *